United States Patent
Atallah et al.

(10) Patent No.: US 9,741,452 B2
(45) Date of Patent: Aug. 22, 2017

(54) READ-ASSIST CIRCUITS FOR MEMORY BIT CELLS EMPLOYING A P-TYPE FIELD-EFFECT TRANSISTOR (PFET) READ PORT(S), AND RELATED MEMORY SYSTEMS AND METHODS

(71) Applicant: QUALCOMM Incorporated, San Diego, CA (US)

(72) Inventors: Francois Ibrahim Atallah, Raleigh, NC (US); Keith Alan Bowman, Morrisville, NC (US); David Joseph Winston Hansquine, Raleigh, NC (US); Jihoon Jeong, Cary, NC (US); Hoan Huu Nguyen, Durham, NC (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/862,712

(22) Filed: Sep. 23, 2015

(65) Prior Publication Data
US 2016/0247559 A1 Aug. 25, 2016

Related U.S. Application Data

(60) Provisional application No. 62/119,756, filed on Feb. 23, 2015.

(51) Int. Cl.
*G11C 29/52* (2006.01)
*G11C 11/419* (2006.01)
(Continued)

(52) U.S. Cl.
CPC .............. *G11C 29/52* (2013.01); *G11C 11/00* (2013.01); *G11C 11/412* (2013.01); *G11C 11/418* (2013.01); *G11C 11/419* (2013.01)

(58) Field of Classification Search
CPC ..... G11C 11/412; G11C 11/418; G11C 11/419; H01L 27/11
See application file for complete search history.

(56) References Cited

U.S. PATENT DOCUMENTS 4,623,989 A 11/1986 Blake
4,660,177 A 4/1987 O'Connor
(Continued)

OTHER PUBLICATIONS

Invitation to Pay Additional Fees and Partial Search Report for PCT/US2016/016120, mailed May 11, 2016, 8 pages.
(Continued)

*Primary Examiner* — J. H. Hur
*Assistant Examiner* — Ajay Ojha
(74) *Attorney, Agent, or Firm* — W&T/Qualcomm

(57) ABSTRACT

Read-assist circuits for memory bit cells employing a P-type Field-Effect Transistor (PFET) read port(s) are disclosed. Related memory systems and methods are also disclosed. It has been observed that as node technology is scaled down in size, PFET drive current (i.e., drive strength) exceeds N-type FET (NFET) drive current for like-dimensioned FETs. In this regard, in one aspect, it is desired to provide memory bit cells having PFET read ports, as opposed to NFET read ports, to increase memory read times to the memory bit cells, and thus improve memory read performance. To mitigate or avoid a read disturb condition that could otherwise occur when reading the memory bit cell, read-assist circuits are provided for memory bit cells having PFET read ports.

27 Claims, 14 Drawing Sheets

(51) Int. Cl.
*G11C 11/00* (2006.01)
*G11C 11/412* (2006.01)
*G11C 11/418* (2006.01)

(56) References Cited

U.S. PATENT DOCUMENTS

| | | | |
|---|---|---|---|
| 5,701,095 A | 12/1997 | Ohsawa | |
| 5,771,190 A | 6/1998 | Okamura | |
| 6,205,068 B1 | 3/2001 | Yoon | |
| 6,341,083 B1 | 1/2002 | Wong | |
| 6,449,202 B1 | 9/2002 | Akatsu et al. | |
| 7,038,962 B2 | 5/2006 | Yamagami | |
| 7,064,584 B2 | 6/2006 | Bertram et al. | |
| 7,164,596 B1 | 1/2007 | Deng et al. | |
| 7,256,621 B2 | 8/2007 | Lih et al. | |
| 7,403,426 B2 | 7/2008 | Hamzaoglu et al. | |
| 7,881,137 B2* | 2/2011 | Chen | G11C 7/12 365/203 |
| 8,427,896 B1 | 4/2013 | Agarwal et al. | |
| 8,488,369 B2 | 7/2013 | Chandra et al. | |
| 8,576,649 B1 | 11/2013 | Nemati | |
| 9,293,192 B1 | 3/2016 | Wong | |
| 2002/0003244 A1 | 1/2002 | Tooher et al. | |
| 2002/0159312 A1 | 10/2002 | Kasai et al. | |
| 2004/0100810 A1 | 5/2004 | Towler et al. | |
| 2005/0207210 A1 | 9/2005 | Barth, Jr. et al. | |
| 2006/0215441 A1 | 9/2006 | Matsushige et al. | |
| 2006/0262628 A1 | 11/2006 | Nii et al. | |
| 2007/0058419 A1* | 3/2007 | Khellah | G11C 11/412 365/154 |
| 2007/0177419 A1 | 8/2007 | Sachdev et al. | |
| 2007/0206404 A1 | 9/2007 | Yamagami | |
| 2007/0211517 A1 | 9/2007 | Burnett | |
| 2008/0002497 A1 | 1/2008 | Barth, Jr. et al. | |
| 2008/0117665 A1 | 5/2008 | Abeln et al. | |
| 2008/0158939 A1 | 7/2008 | Chen et al. | |
| 2009/0059706 A1 | 3/2009 | Wong | |
| 2011/0122712 A1 | 5/2011 | Idgunji et al. | |
| 2011/0280094 A1 | 11/2011 | Heymann et al. | |
| 2012/0063211 A1 | 3/2012 | Sharma et al. | |
| 2012/0213023 A1* | 8/2012 | Dawson | G11C 7/1048 365/203 |
| 2013/0286717 A1 | 10/2013 | Adams et al. | |
| 2014/0003160 A1 | 1/2014 | Trivedi et al. | |
| 2014/0050012 A1 | 2/2014 | Guillemenet et al. | |
| 2014/0151811 A1 | 6/2014 | Liaw | |
| 2014/0151812 A1* | 6/2014 | Liaw | H01L 21/76895 257/368 |
| 2014/0153322 A1 | 6/2014 | Liaw | |
| 2014/0160871 A1 | 6/2014 | Zimmer et al. | |
| 2014/0204657 A1 | 7/2014 | Dally | |
| 2014/0204687 A1 | 7/2014 | Sinangil et al. | |
| 2014/0269018 A1 | 9/2014 | Jin et al. | |
| 2015/0009751 A1 | 1/2015 | Kulkarni et al. | |
| 2015/0085568 A1 | 3/2015 | Gulati et al. | |
| 2015/0091609 A1 | 4/2015 | Srinath et al. | |
| 2015/0194208 A1* | 7/2015 | Nagle | G11C 8/08 365/154 |
| 2016/0188889 A1 | 6/2016 | Narendra Trivedi et al. | |
| 2016/0247556 A1 | 8/2016 | Jeong et al. | |
| 2016/0247557 A1 | 8/2016 | Jeong et al. | |
| 2016/0247558 A1 | 8/2016 | Jeong et al. | |

OTHER PUBLICATIONS

Cheng, K-L., et al., "A Highly Scaled, High Performance 45nm Bulk Logic CMOS Technology with 0.242 $\mu m^2$ SRAM Cell," IEDM 2007, IEEE International Electron Devices Meeting, Washington, DC, 2007, pp. 243-246.

Chik R.Y.V., "Design Techniques for Low-Voltage BiCMOS Digital Circuits," Dissertation, 1996, 127 Pages.

Diaz, C. H., et al., "32nm Gate-First High-k/Metal-Gate Technology for High Performance Low Power Applications," IEDM 2008, IEEE International Electron Devices Meeting, San Francisco, CA, 2008, pp. 1-4.

Fung, Samuel K. H., et al., "65 nm CMOS High Speed, General Purpose and Low Power Transistor Technology for High Volume Foundry Application," 2004 Symposium on VLSI Technology, Digest of Technical Papers, IEEE, Jun. 15-17, 2004, pp. 92-93.

Jeong, J., et al., "A 16nm Configurable Pass-Gate Bit-Cell Register File for Quantifying the VMIN Advantage of PFET versus NFET Pass-Gate Bit Cells," Proceedings of the IEEE Custom Integrated Circuits Conference (CICC), Sep. 2015, 4 pages.

Wu, C. C., et al., "A 90-nm CMOS Device Technology with High-speed, General-purpose, and Low-leakage Transistors for System on Chip Applications," IEDM '02, International Electron Devices Meeting, San Francisco, CA, Dec. 8-11, 2002, pp. 65-68.

Wu, C.C., et al., "High Performance 22/20nm FinFET CMOS Devices with Advanced High-K/Metal Gate Scheme," 2010 IEEE International Electron Devices Meeting (IEDM), San Francisco, CA, Dec. 6-8, 2010, pp. 27.1.1-27.1.4.

Wu, S-Y. et al., "A 16nm FinFET CMOS Technology for Mobile SoC and Computing Applications," 2013 IEEE International Electron Devices Meeting (IEDM), Dec. 9-11, 2013, Washington, DC, pp. 9.1.1-9.1.4.

Young, K. K., et al., "A 0.13 $\mu m$ CMOS Technology with 193 nm Lithography and Cu/Low-k for High Performance Applications," 2000 International Electron Devices Meeting, IEDM Technical Digest, Dec. 10-13, 2000, pp. 23.2.1-23.2.4.

Zhu Z., "High Performance CMOS Digital Circuit Design," Dissertation, May 1998, 142 pages.

International Search Report and Written Opinion for PCT/US2016/016120, mailed Sep. 21, 2016, 22 pages.

Second Written Opinion for PCT/US2016/016120, mailed Mar. 7, 2017, 9 pages.

* cited by examiner

READ-ASSIST CIRCUITS FOR MEMORY BIT CELLS EMPLOYING A P-TYPE FIELD-EFFECT TRANSISTOR (PFET) READ PORT(S), AND RELATED MEMORY SYSTEMS AND METHODS

PRIORITY APPLICATION

The present application claims priority under 35 U.S.C. §119(e) to U.S. Provisional Patent Application Ser. No. 62/119,756 filed on Feb. 23, 2015 and entitled "READ-ASSIST CIRCUITS FOR MEMORY BIT CELLS EMPLOYING A P-TYPE FIELD-EFFECT TRANSISTOR (PFET) READ PORT(S), AND RELATED MEMORY SYSTEMS AND METHODS," which is incorporated herein by reference in its entirety.

BACKGROUND

I. Field of the Disclosure

The technology of the disclosure relates generally to memory systems employing addressable static memory bit cells for reading and writing data, and more particularly to read-assist circuits for mitigating read disturb conditions when reading from bit cells.

II. Background

Supply voltage (i.e., Vdd) scaling is an effective technique for maximizing processor energy efficiency across all market segments, ranging from small, embedded cores in a system-on-a-chip (SoC) to large multicore servers. As supply voltage in processor-based systems is reduced to conserve power, circuit delay sensitivity to parameter variations amplifies, eventually resulting in circuit failures. These circuit failures limit the minimum operating supply voltage and the maximum energy efficiency of processor-based systems. In current processor-based system designs, static random-access memory (SRAM) caches and/or register files limit the minimum operation supply voltage. SRAM cache and register file bit cells employ near minimum-sized transistors to maximize capacity. Since uncorrelated parameter variations (e.g., random-dopant fluctuations, line-edge roughness) are inversely proportional to the square-root of the transistor gate area, wide differences exist for the memory bit cell minimum operating voltage to read, write, and retain data.

In this regard, FIG. 1 is a schematic diagram of an exemplary SRAM system 100 employing memory bit cells 102(0)(0)-102(M)(N) ("bit cells 102(0)(0)-102(M)(N)") for storing data in a data array 104. The data array 104 is organized as having 'M+1' bit cell columns and 'N+1' bit cell rows of bit cells 102 supporting an "N+1" bit wide data word. A bitline driver 112(0)-112(N) is provided for each bit cell column 0-N to drive a selected bitline 114(0)-114(N) and a complement bitline (bitline_b) 114'(0)-114'(N) for read and write operations. A wordline driver 108(0)-108(M) is provided for each bit cell row 0-M in the data array 104 to control access to the addressed bit cells 102( )(0)-102( )(N) in a given bit cell row 0-M based on an index(0)-index(M) decoded from a memory address indicating the bit cell row 0-M to be selected. A clock signal (clk) 110 controls the timing of asserting the activated wordline 106(0)-106(M) to access a row of bit cells 102( )(0)-102( )(N) in the selected bit cell row 0-M. The wordline driver 108(0)-108(M) for the selected bit cell row 0-M causes the data stored in the selected bit cells 102( )(0)-102( )(N) to be asserted onto the bitlines 114(0)-114(N) and complement bitlines 114'(0)-114'(N) to be sensed by sense amplifiers 116(0)-116(N) provided in each bit cell column 0-N. The sense amplifiers 116(0)-116(N) provide the data bits from the selected bit cells 102( )(0)-1020(N) onto respective data output lines 118(0)-118(N).

FIG. 2 is a circuit diagram of a bit cell 102 in the SRAM system 100 in FIG. 1. In this example, the bit cell 102 is a standard six (6) transistor (6-T) static complement memory bit cell. The bit cell 102 comprises two (2) cross-coupled inverters 120(0), 120(1) powered by voltage Vdd. The cross-coupled inverters 120(0), 120(1) reinforce each other to retain data in the form of a voltage on a respective true storage node (T) 122 and a complement storage node (C) 122'. Each inverter 120(0), 120(1) is comprised of a respective pull-up P-type field-effect transistor (PFET) 124(0), 124(1) coupled in series to a respective pull-down N-type field-effect transistor (NFET) 126(0), 126(1). NFET access transistors 128(0), 128(1) are coupled to the respective inverters 120(0), 120(1) to provide respective read/write ports 130(0), 130(1) to the bit cell 102. In a read operation, the bitline 114 and complement bitline 114' are pre-charged to voltage Vdd. Then, the wordline 106 coupled to gates (G) of the NFET access transistors 128(0), 128(1) is asserted to evaluate the differential voltages on the true storage node 122 and complement node 122' to read the bit cell 102. If a logic high voltage level (i.e., a '1') is stored at the true storage node 122 (T=1) and a logic low voltage level (i.e., '0') is stored at the complement storage node 122' (C=0), assertion of the wordline 106 will cause the NFET access transistor 128(1) to discharge the pre-charged voltage on the complement bitline 114' to the complement storage node 122' and through the NFET 126(1) to ground. However, if the NFET access transistor 128(1) is a faster device than the PFET 124(1), the discharge of the pre-charged voltage on the complement bitline 114' can cause a charge build up on complement storage node 122' that can cause inverter 120(0) to flip the voltage on the true storage node 122 from a logic '1' to a logic '0', which may cause a subsequent read operation to the bit cell 102 to return erroneous data. This is known as a read disturb condition.

To mitigate or avoid a read disturb condition from occurring in the bit cell 102 in FIG. 2, the NFET access transistors 128(0), 128(1) could be weakened and the PFETs 124(0), 124(1) in the inverters 120(0), 120(1) be strengthened. However, this can cause write contention issues in the bit cell 102. FIG. 3 is a circuit diagram illustrating a write contention between the NFET access transistor 128(0) and the PFET 124(0) in the inverter 120(0) in the bit cell 102 in FIG. 2. For example, during a write operation, if a logic '1' is stored in the true storage node 122 (T=1) (and a logic '0' is stored in the complement storage node 122' (C-0)) and the data placed on the bitline 114 to be written to the true storage node 122 is a logic '0', the NFET access transistor 128(0) discharges the true storage node 122 to the bitline 114 to write a logic '0' to the true storage node 122. The NFET access transistor 128(0) is capable of passing a strong logic '0'. However, the logic '0' stored in the complement storage node 122' can cause the strengthened PFET 124(0) to overcome the drive strength of the NFET access transistor 128(0) to charge the true storage node 122 to voltage Vdd (i.e., a logic '1'), thus causing a write contention on the true storage node 122.

SUMMARY OF THE DISCLOSURE

Aspects of the disclosure involve read-assist circuits for memory bit cells ("bit cells") employing a P-type field-effect transistor (PFET) read port(s). Related methods and systems are also disclosed. The memory bit cells are provided in a data array of a memory system in a processor-based system to store data. It has been observed that as node technology is scaled down in size, PFET drive current (i.e., drive strength) exceeds N-type field-effect transistor (NFET) drive current for like-dimensioned FETs. This is due to the introduction of strained silicon in FET fabrication to reduce the effective mass of charge carriers. The read port is a performance critical element in a memory bit cell. In this regard, in one aspect, it is desired to provide memory bit cells having PFET read ports, as opposed to NFET read ports, to reduce memory read times to the memory bit cells, and thus improve memory read performance. To mitigate or avoid a read disturb condition that could otherwise occur when reading the memory bit cell, read-assist circuits are provided for memory bit cells having PFET read ports to mitigate a read disturb condition that could otherwise occur when reading the memory bit cells. By mitigating or avoiding read disturb conditions in the memory bit cells, the voltage supply providing the minimum voltage to the memory bit cells for operation and data retention can be reduced to reduce power consumption and increase processor energy efficiency.

In this regard, in one aspect, a memory system is provided. The memory system comprises a memory bit cell. The memory bit cell comprises a storage circuit configured to store data. The memory bit cell also comprises one or more PFET access transistors coupled to the storage circuit. Each of the one or more PFET access transistors comprises a gate configured to be activated by a wordline in response to a read operation to cause the one or more PFET access transistors to pass the data from the storage circuit to a bitline read-assist circuit coupled to the memory bit cell. The memory system also comprises a read-assist circuit configured to boost a voltage in the memory bit cell in response to the read operation to assist in transferring the data from the storage circuit to a bitline.

In another aspect, a method of reading data from a memory bit cell is provided. The method comprises pre-discharging at least one bitline coupled to an access node of one or more PFET access transistors in a memory bit cell in response to a read operation. The method also comprises activating a wordline coupled to a gate of the one or more PFET access transistors in response to the read operation to transfer data from a storage circuit to the access node and the at least one bitline. The method also comprises boosting a voltage in the memory bit cell in response to the read operation to assist in transferring the data from the storage circuit to the access node.

In another aspect, a non-transitory computer-readable medium having stored thereon computer data for a library cell for an integrated circuit (IC). The library cell comprises a memory system that comprises a memory bit cell. The memory bit cell comprises a storage circuit configured to store data. The memory bit cell also comprises one or more PFET access transistors coupled to the storage circuit. Each of the one or more PFET access transistors comprises a gate configured to be activated by a wordline in response to a read operation to cause the one or more PFET access transistors to pass the data from the storage circuit to a bitline read-assist circuit coupled to the memory bit cell. The memory system also comprises a read-assist circuit configured to boost a voltage in the memory bit cell in response to the read operation to assist in transferring the data from the storage circuit to a bitline.

BRIEF DESCRIPTION OF THE FIGURES

in a cross-coupled inverter storage circuit in the memory bit cell in FIG. 5, to strengthen the PFETs in the storage circuit to be stronger than PFET access transistors in the memory bit cell in response to a read operation to mitigate or avoid a read disturb condition.

DETAILED DESCRIPTION

Figure 1:
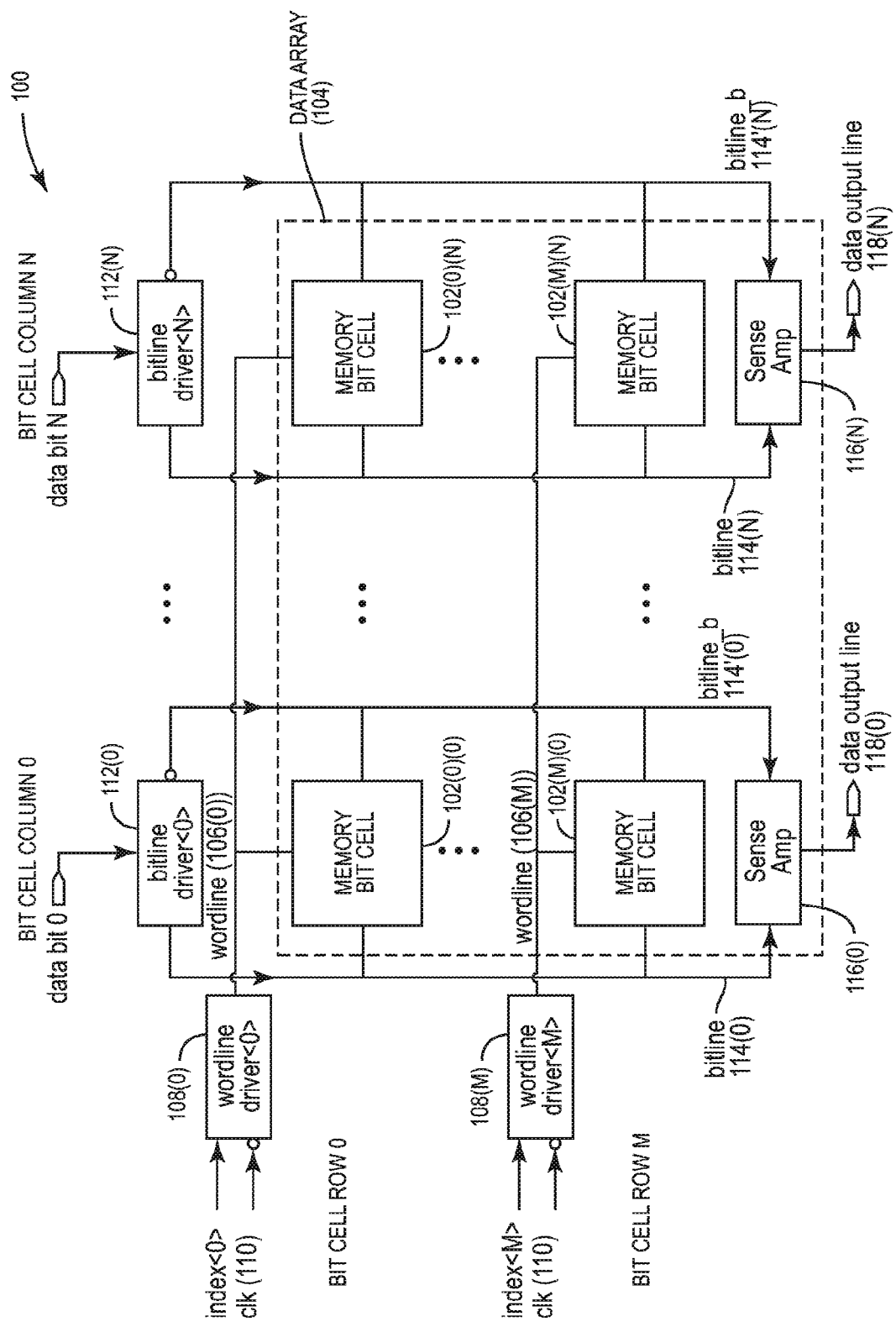
FIG. 1 is a schematic diagram of an exemplary processor-based memory system employing a static random access memory (SRAM) system comprising a data array of static memory bit cells organized in rows and columns for storing data.
Figure 2:
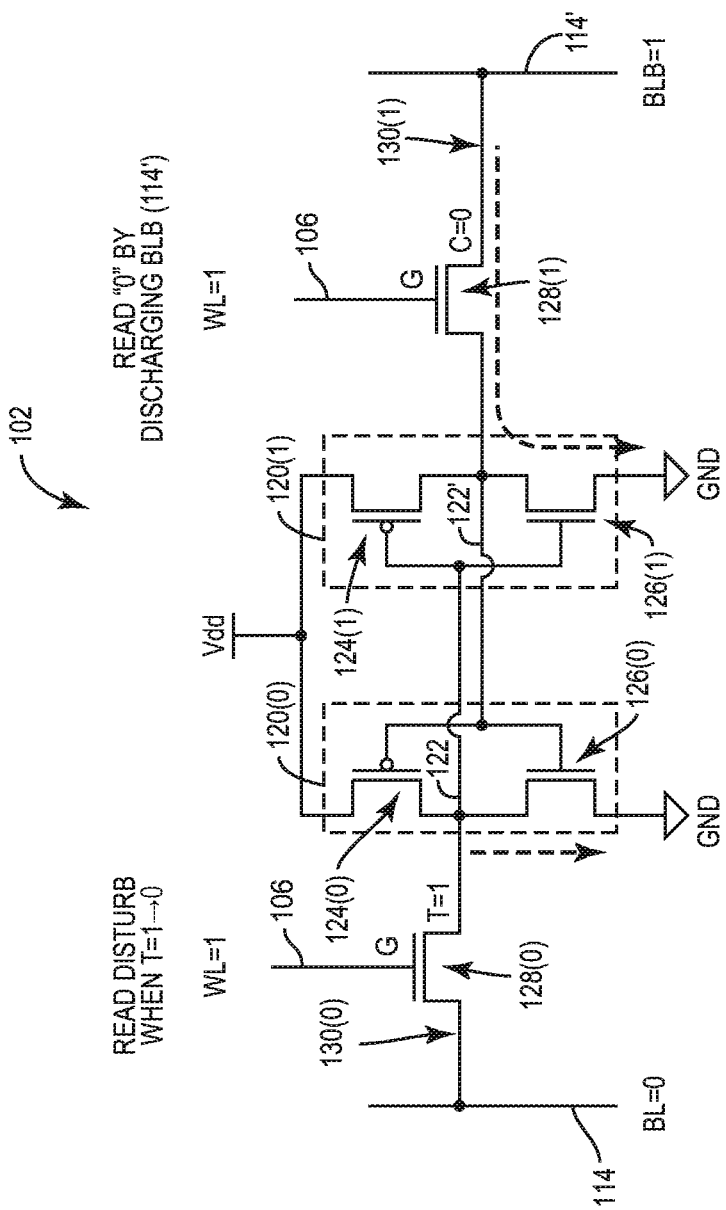
FIG. 2 is a circuit diagram illustrating a read disturb condition in a standard six (6) transistor (6-T) static complement memory bit cell that can be employed in the data array in the SRAM system in FIG. 1.
Figure 3:
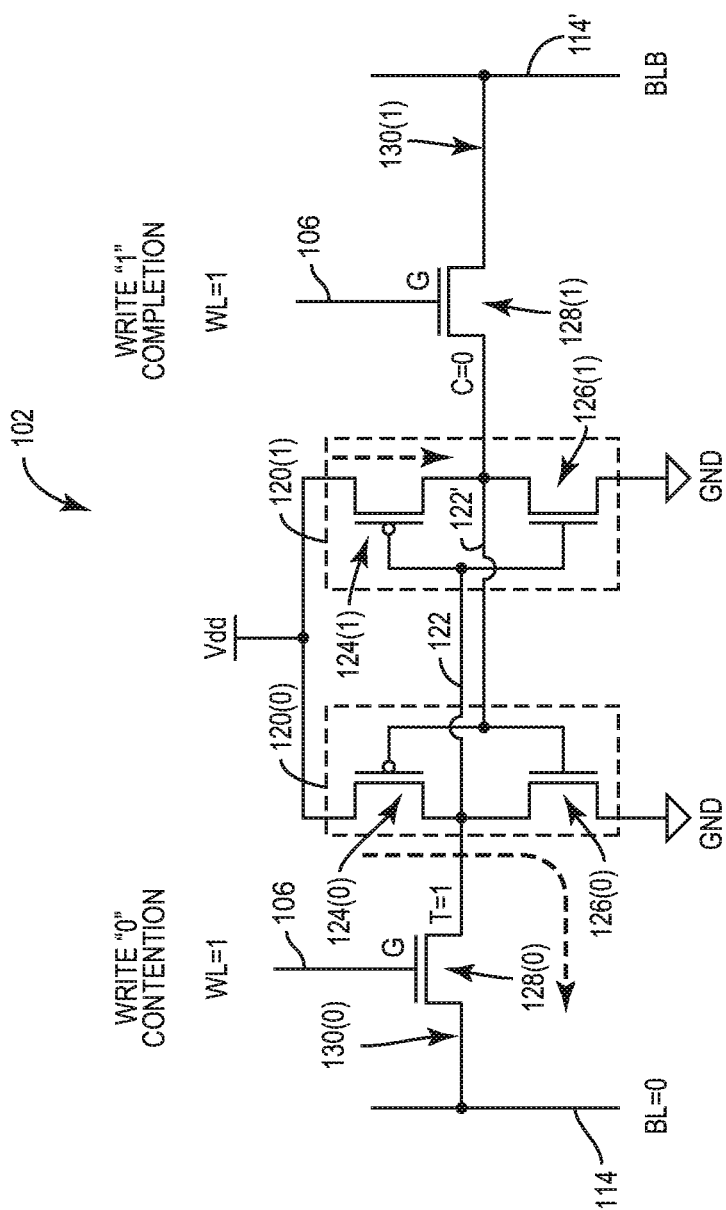
FIG. 3 is a circuit diagram illustrating a write contention between an N-type field-effect transistor (NFET) access transistor and an inverter P-type field-effect transistor (PFET) in a standard 6-T static complement memory bit cell that can be employed in the data array in the SRAM system in FIG. 1.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 4:
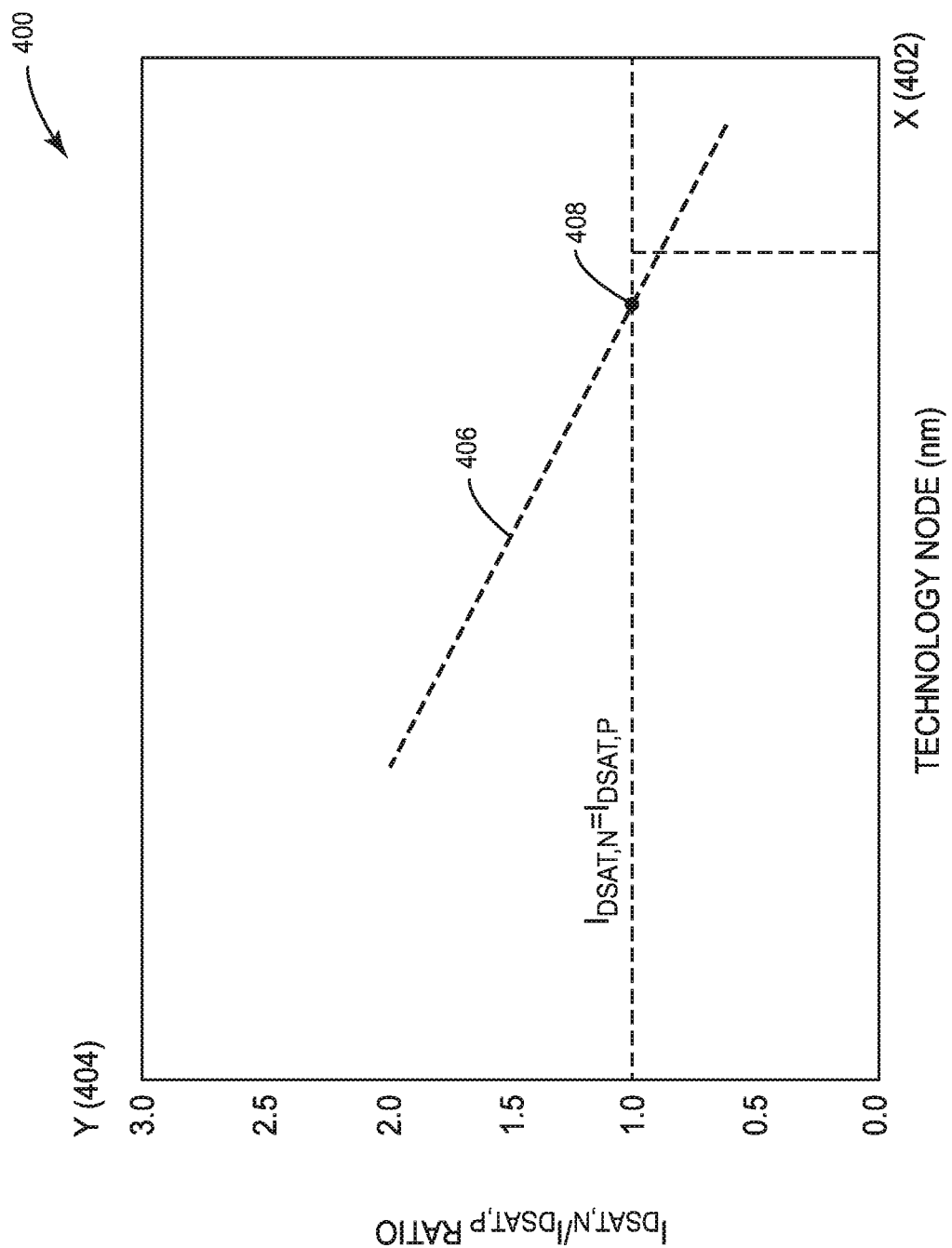
FIG. 4 is a graph illustrating relative saturation drain currents ($I_{DSAT}$) of NFET and PFET technology as a function of technology node size.

Memory bit cells are provided in a data array of a memory system in a processor-based system to store data. As shown in a graph 400 in FIG. 4, it has been observed that as node technology is scaled down in size, PFET drive current (i.e., drive strength) exceeds N-type field-effect transistor (NFET) drive current for like-dimensioned FETs. This is due to the introduction of strained silicon in FET fabrication to reduce the effective mass of charge carriers. As illustrated in FIG. 4, the technology node size in nanometers (nm) is provided on an X-axis 402. The ratio of a saturation drain current ($I_{DSAT, N}$) of an NFET to the saturation drain current of a PFET ($I_{DSAT, N}/I_{DSAT, P}$) is provided on a Y-axis 404. The ratio of $I_{DSAT, N}$ to $I_{DSAT, P}$ as a function of technology node size in nm is shown on a ratio line 406. As shown by the ratio line 406 in FIG. 4, a PFET drive strength increases as compared to a like-dimensioned NFET as the technology node size decreases. At point 408, the ratio line 406 crosses a ratio of 1.0 of NFET drive current to PFET drive strength. Thus, in this example, the drive strength of the PFET is greater than the drive strength of a like-dimensioned NFET.

In this regard, as discussed in more detail below, aspects disclosed herein involve read-assist circuits for memory bit cells employing a P-type field-effect transistor (PFET) read port(s). A read port may be a performance critical element in a memory bit cell. In this regard, in one aspect, it is desired to provide memory bit cells having PFET read ports, as opposed to NFET read ports, to decrease memory read times to the memory bit cells, and thus improve memory read performance. As shown in the saturation drive current ($I_{DSAT}$) equation below, an increase in the charge carrier effective mobility results in an increase in drive current ($I_D$).

$$I_D = \tfrac{1}{2} \mu C_{ox} W/L (V_{GS} - V_{TH})^2$$

where:
- 'μ' is the charge carrier effective mobility,
- 'W' is the gate width,
- 'L' is the gate length,
- '$C_{ox}$' is the capacitance of the oxide layer;
- '$V_{GS}$' is the gate to source Voltage, and
- '$V_{TH}$' is the threshold voltage.

In this regard, in one aspect, it is desirable to provide memory bit cells having PFET write ports, as opposed to NFET write ports, to reduce memory read times to the memory bit cells, and thus improve memory performance. To mitigate or avoid a read disturb condition that could otherwise occur when reading the memory bit cell, read-assist circuits are provided for memory bit cells having PFET read ports. By mitigating or avoiding read disturb conditions in the memory bit cells, the voltage supply providing the minimum voltage to the memory bit cells for operation and data retention can be reduced to reduce power consumption and increase processor energy efficiency.

Figure 5:
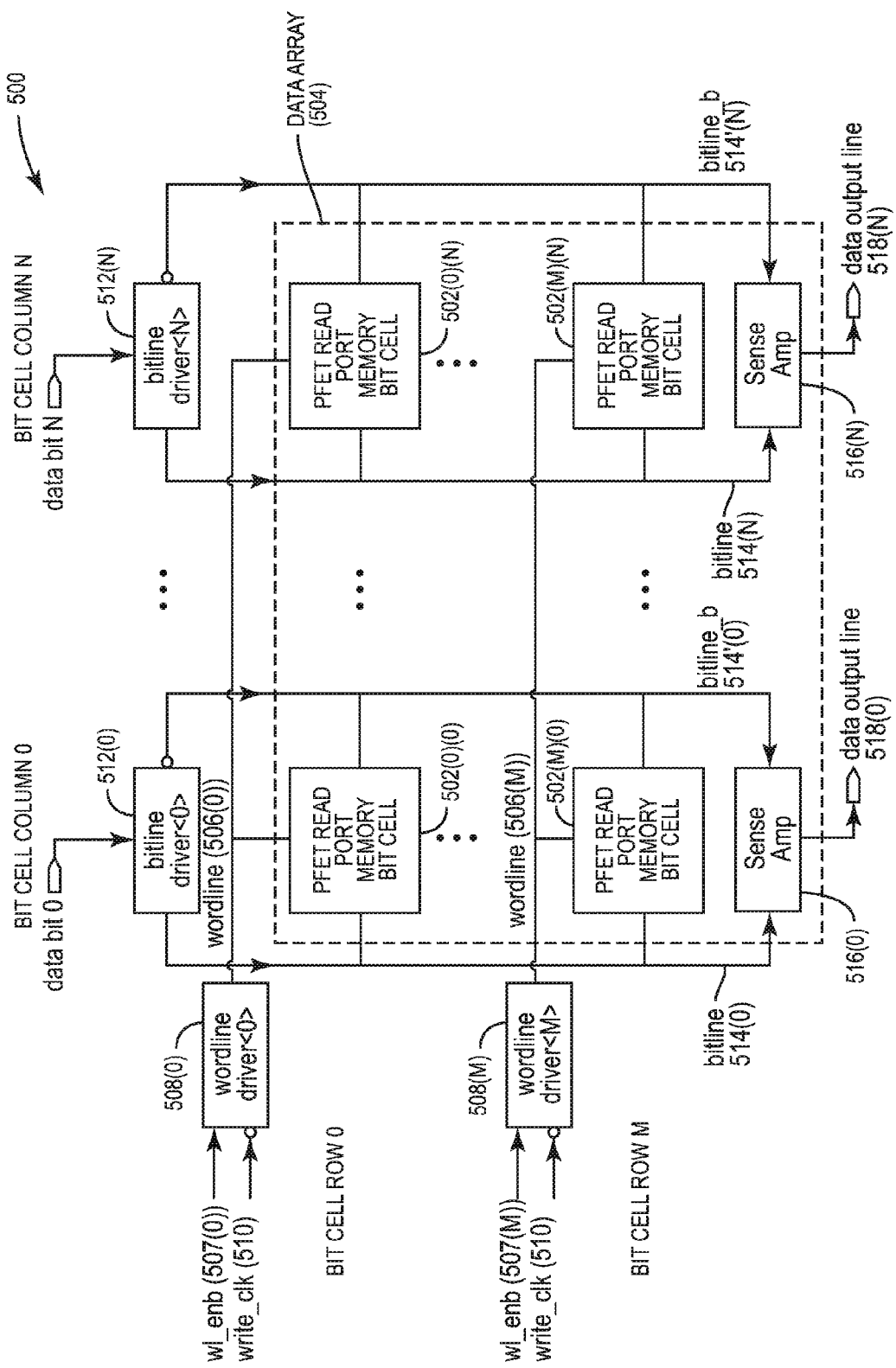
FIG. 5 is a schematic diagram of an exemplary processor-based memory system employing an SRAM system comprising a data array of static memory bit cells employing a PFET read port.

In this regard, FIG. 5 is a schematic diagram of an exemplary SRAM system 500 employing PFET read port memory bit cells 502(0)(0)-502(M)(N) (also referred to herein as "memory bit cells 502(0)(0)-502(M)(N)"). PFET read port memory bit cells 502 are memory bit cells that each have one or more PFET read ports. As discussed above, if the technology node of the memory bit cells 502(0)(0)-502(M)(N) is scaled down far enough, the memory bit cells 502(0)(0)-502(M)(N) will perform read operations faster than similar memory bit cells employing NFET read ports. The memory bit cells 502(0)(0)-502(M)(N) are configured to store data in a data array 504. As a non-limiting example, the memory bit cells 502(0)(0)-502(M)(N) may be standard six (6) transistor (6-T) or eight (8) transistor (8-T) static complement memory bit cells. The data array 504 is organized as having 'M+1' bit cell columns and 'N+1' bit cell rows of memory bit cells 502 supporting an "N+1" bit wide data word. For any given bit cell row 0-M in the data array 504, each bit cell column 0-N of the data array 504 includes a memory bit cell 502 in which a single data value or bit is stored.

With continuing reference to FIG. 5, write operations to the memory bit cells 502(0)(0)-502(M)(N) are controlled by respective wordlines 506(0)-506(M) corresponding to each bit cell row 0-M. A read operation is performed on the memory bit cells 502( )(0)-502( )(N) in a given bit cell row 0-M based on an index(0)-index(M) generated as a result of decoding a memory address in a memory read operation indicating the bit cell row 0-M to be read. A wordline driver 508(0)-508(M) is provided for each bit cell row 0-M in the data array 504 to control reading to the addressed memory bit cells 502( )(0)-502( )(N) in a given bit cell row 0-M based on the received respective index(0)-index(M). Thus, only one wordline driver 508(0)-508(M) is activated at a time in this example. A read clock signal (read_clk) 510 controls the timing of asserting the activated wordline (WL) 506(0)-506(M) to read the memory bit cells 5020(0)-502(0)(N) in the selected bit cell row 0-M.

With continuing reference to FIG. 5, a bitline driver 512(0)-512(N) is provided for each bit cell column 0-N in the SRAM system 500 for reading data from memory bit cells 502( )(0)-5020(N) in the selected bit cell row 0-M. In this regard, the bitline drivers 512(0)-512(N) drive a bitline 514(0)-514(N) and a complement bitline (bitline_b) 514'(0)-514'(N), because the memory bit cells 502(0)(0)-502(M)(N) employ a complement bitline architecture.

In a write operation, data bits 0-N to be written are provided to respective bitline drivers 512(0)-512(N) to drive the received data bits 0-N and their complement data bits onto the bitlines 514(0)-514(N) and complement bitlines 514'(0)-514'(N), respectively. The wordline driver 508(0)-508(M) for the selected bit cell row 0-M is activated to select the memory bit cells 5020(0)-5020(N) to be written. The data bits 0-N asserted on the bitlines 514(0)-514(N) and complement bitlines 514'(0)-514'(N), respectively, are written into the selected memory bit cells 502( )(0)-502( )(N).

In a read operation, the bitline drivers 512(0)-512(N) pre-discharge the bitlines 514(0)-514(N) and complement bitlines 514'(0)-514'(N) during a pre-discharge stage. The wordline driver 508(0)-508(M) for the selected bit cell row 0-M causes the data stored in the selected memory bit cells 502( )(0)-502( )(N) to be asserted onto the bitlines 514(0)-514(N) and complement bitlines 514'(0)-514'(N) to be sensed by sense amplifiers 516(0)-516(N) provided in each bit cell column 0-N. The sense amplifiers 516(0)-516(N) provide the data bits from the selected memory bit cells 502( )(0)-502( )(N) onto respective data output lines 518(0)-518(N).

Figure 6A:
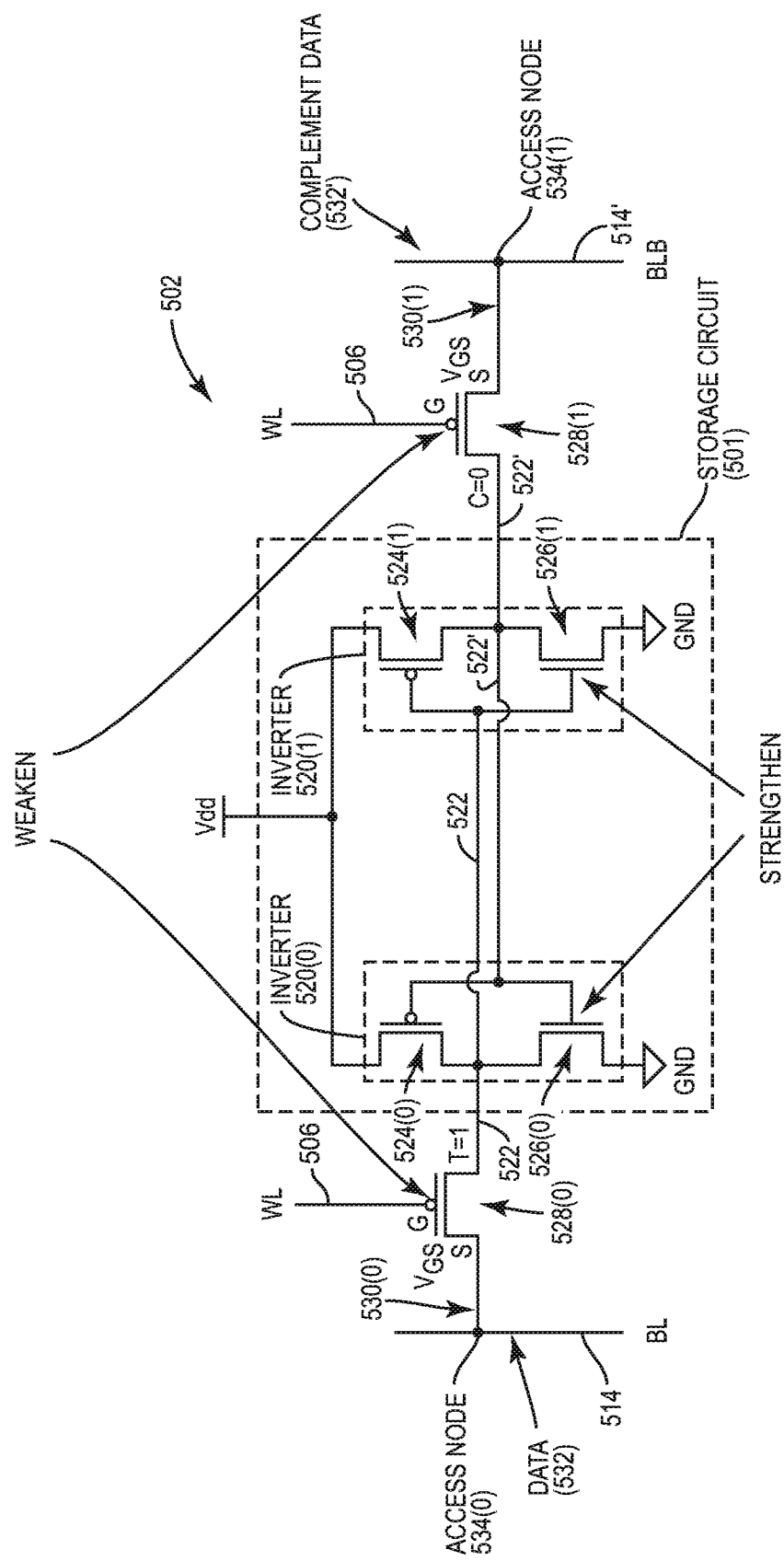
FIG. 6A is a circuit diagram illustrating an exemplary avoidance of a read disturb condition in a standard 6-T static complement memory bit cell employing a PFET read port in the data array in the SRAM system in FIG. 5.
Figure 6B:
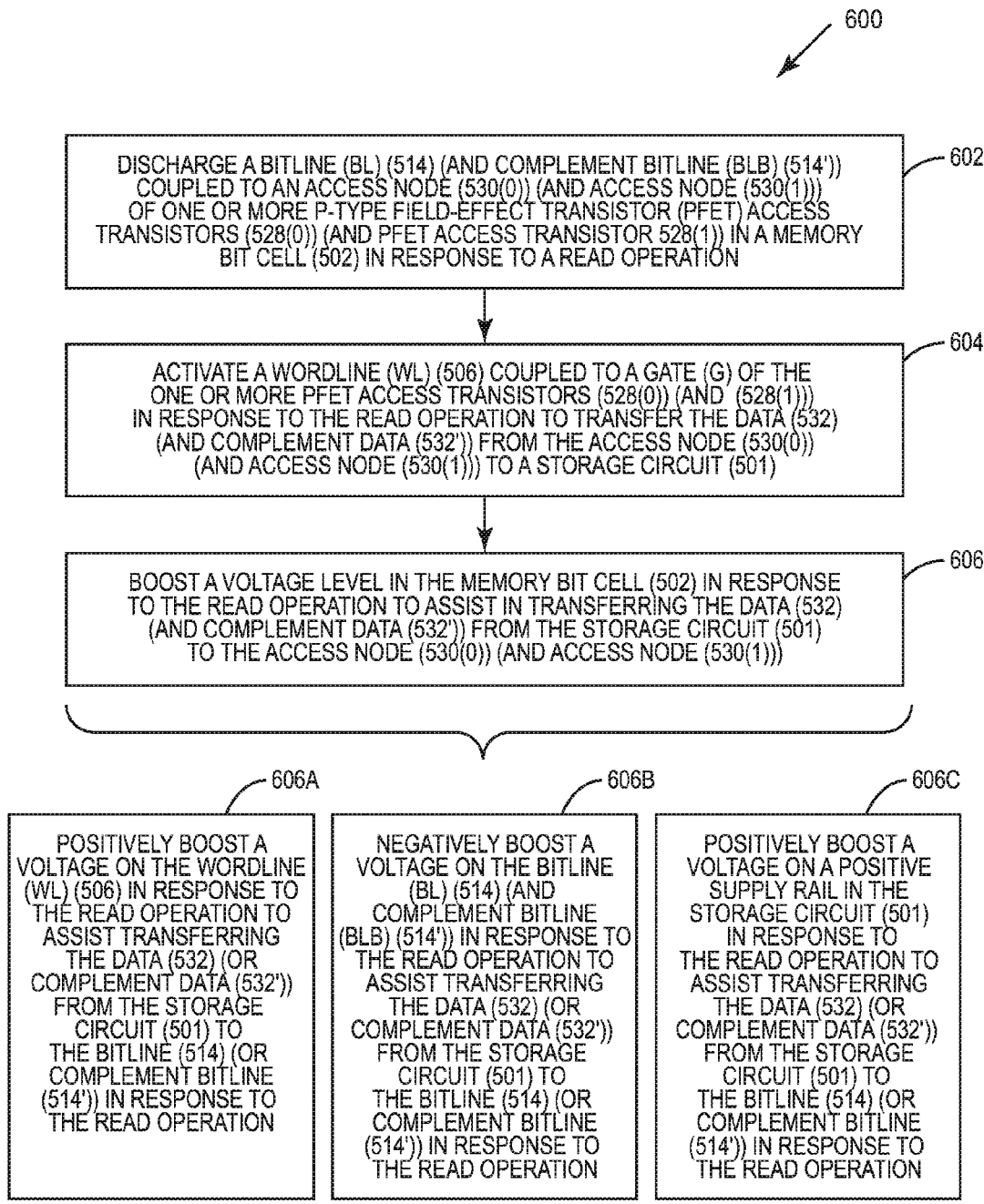
FIG. 6B is a flowchart illustrating exemplary processes providing read assistance for a memory bit cell including PFET access transistors in FIG. 6A to avoid or reduce read disturb conditions in the memory bit cell in response to a read operation.

FIG. 6A is a circuit diagram illustrating how to avoid a read disturb condition in a PFET read port memory bit cell 502 employing a PFET read/write port in the data array 504 in the SRAM system 500 in FIG. 5. FIG. 6B is a flowchart illustrating an exemplary process 600 for avoiding read disturb conditions in the storage circuit 501 in response to a read operation. The process 600 in FIG. 6B will be discussed on conjunction with FIG. 6A.

With reference to FIG. 6A, the PFET read port memory bit cell 502 comprises a storage circuit 501 in this example comprised of two (2) cross-coupled inverters 520(0), 520(1) powered by voltage Vdd. A true storage node (T) 522 and a complement storage node (C) 522' retain data 532 (i.e., a charge) and complement data 532' (i.e, a complement charge to the data 532), respectively, in the form of voltages on the respective true storage node (T) 522 and the complement storage node (C) 522'. Each inverter 520(0), 520(1) is comprised of a respective pull-up PFET 524(0), 524(1) coupled in series to a respective pull-down NFETs 526(0), 526(1). Instead of providing NFET access transistors, PFET access transistors 528(0), 528(1) are coupled to the respective inverters 520(0), 520(1) to provide respective PFET read ports 530(0), 530(1) to the PFET read port memory bit cell 502.

In this regard, in a read operation, the bitline 514 and complement bitline 514' are pre-discharged to a low voltage (e.g., GND voltage) (block 602 in FIG. 6B). Then, the wordline (WL) 506 coupled to gates (G) of the PFET access transistors 528(0), 528(1) is activated or asserted to evaluate the differential voltages on the true storage node 522 and complement node 522' to determine the stage of the data 532 and complement data 532' stored in the storage circuit 501 of the memory bit cell 502 (block 604 in FIG. 6B). For example, FIG. 6A illustrates a logic high voltage level (i.e., a '1') is stored at the true storage node 522 (T=1) and a logic low voltage level (i.e., '0') stored at complement storage node 522' (C=0). The PFET 524(0) maintains the charge on the true storage node 522. Assertion of a low voltage (e.g., GND voltage) on the wordline (WL) 506 after floating the bitline 514 and the complement bitline 514' to read the memory bit cell 502 will cause the PFET access transistor 528(0) to charge the voltage on the bitline 514 (i.e., charge the bitline 514). Similarly, assertion of a low voltage (e.g., GND voltage) on the wordline (WL) 506 to read the memory bit cell 502 will not charge the complement bitline 514' since the voltage on the complement bitline 514' was pre-discharged to a low voltage (e.g, GND voltage) and the voltage at the complement storage node (C) 522' is also the low voltage.

However, if the PFET 524(0) has a weak drive strength and is thus a slower device relative to a similarly sized NFET, as the bitline 514 is being charged by the PFET access transistor 528(0), the PFET 524(0) may not have enough drive strength to quickly re-charge any lost charge on the true storage node 522 as the voltage of the data 532 at the true storage node 522 is coupled to the bitline 514. This loss of charge due to charge sharing at the true storage node 522 can cause inverter 520(1) to flip the voltage on the complement storage node 522' from a logic '0' to a logic '1', which may cause a subsequent read operation to the memory bit cell 502 to return erroneous data. This is known as a read disturb condition. This read disturb condition can limit the minimum supply voltage for reading the memory bit cell 502 employing PFET read ports 530(0), 530(1).

To mitigate or avoid a read disturb condition from occurring in the memory bit cell 502 in FIG. 6A, the PFET access transistors 528(0), 528(1) could be weakened to decrease their gate (G) voltage-to-source (S) voltage (Vgs) voltages and/or the pull-down PFETs 524(0), 524(1) in the inverters 520(0), 520(1) could be strengthened (block 606 in FIG. 6B). In this regard, read-assist circuits can be provided to boost a voltage in the memory bit cell 502 in the SRAM system 500 in FIG. 5 to assist in transferring data 532 and/or complement data 532' from the storage circuit 501 to the respective bitline 514 and complement bitline 514' (block 606 in FIG. 6B). There are different exemplary read-assist circuits disclosed herein that can be provided for the memory bit cell 502 to mitigate or avoid read disturb contentions in response to read operations. In this manner, as technology node size of the memory bit cell 502 is scaled down, the benefit of the faster read times in the memory bit cell 502 employing the PFET read ports 530(0), 530(1) can be realized while mitigating or avoiding read disturb conditions. By mitigating or avoiding read disturb conditions in the memory bit cell 502, the voltage supply providing the minimum voltage (Vdd) to the memory bit cell 502 for operation and data retention can be reduced to reduce power consumption in the SRAM system 500.

In this regard, as an example to mitigate or avoid read disturb conditions in the PFET write port memory bit cell 502 in FIG. 6A, a read-assist circuit employing a positive wordline boost circuit configured to positively boost the voltage of the wordline (WL) 506 in response to a read operation on the PFET read port memory bit cell 502 can be employed (block 606A in FIG. 6B). Examples of memory systems that include read-assist circuits employing positive wordline boost circuits for a PFET write port memory bit cell are shown in FIGS. 7-10, discussed below.

Figure 11:
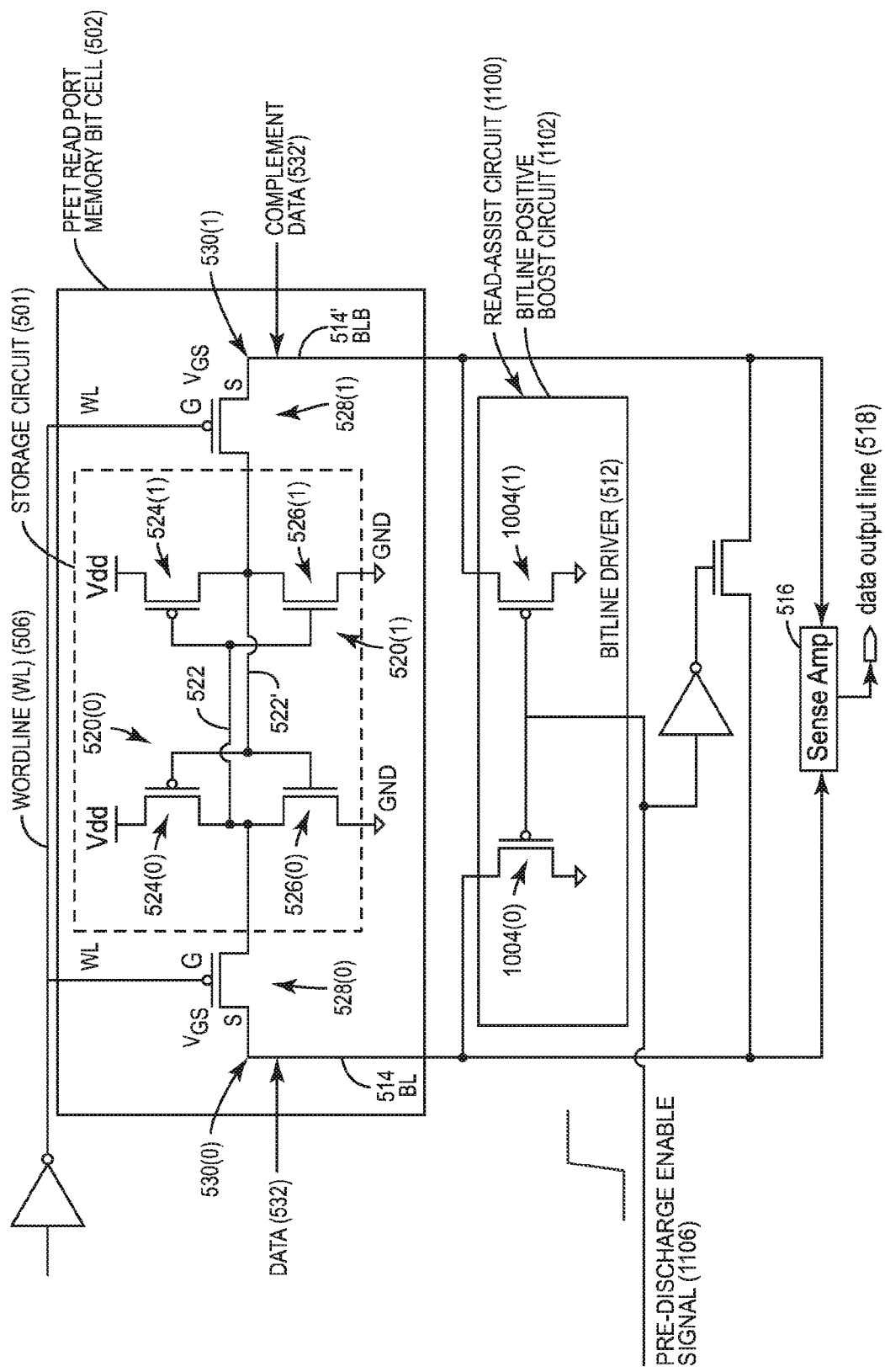
FIG. 11 illustrates an exemplary read-assist circuit that includes an exemplary positive bitline boost circuit provided in a bitline driver to positively boost bitlines of the memory bit cell in FIG. 5 to weaken PFET access transistors in the memory bit cell in response to a read operation to mitigate or avoid a read disturb condition.

Also, as another example to mitigate or avoid read disturb conditions in the PFET write port memory bit cell 502 in FIG. 6A, a read-assist circuit employing a bitline positive boost circuit can be employed. The bitline positive boost circuit is configured to positively boost the voltage of a bitline coupled to the PFET write port memory bit cell 502 in response to a read operation (block 606B in FIG. 6B). Examples of memory systems that include read-assist circuits employing a bitline positive boost circuit for a PFET write port memory bit cell are shown in FIG. 11 discussed below.

Figure 12:
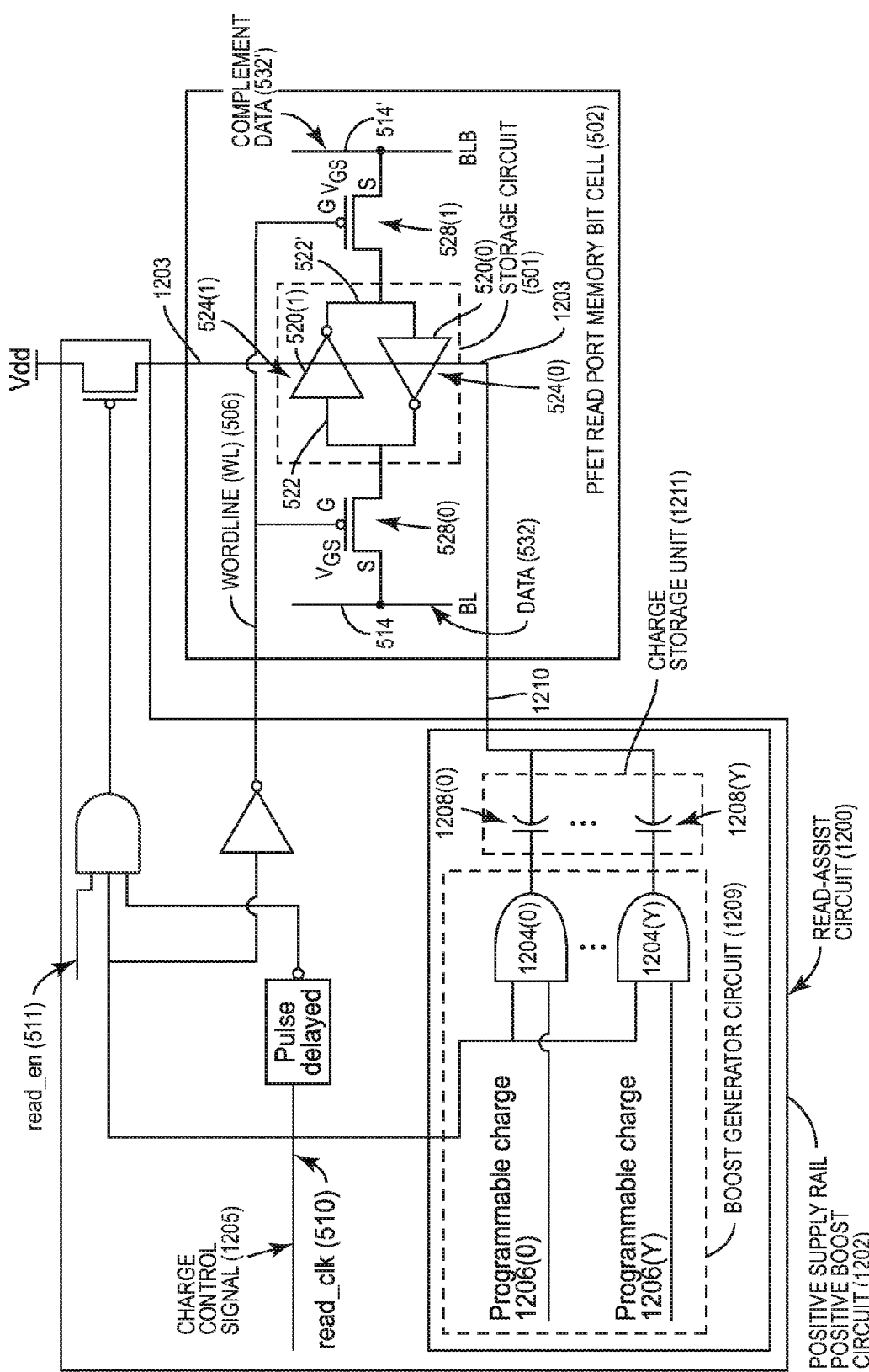
FIG. 12 illustrates an exemplary read-assist circuit that includes an positive supply rail positive boost circuit configured to positively boost a positive supply rail in a PFET(s)

Also, as another example to mitigate or avoid read disturb conditions in the PFET write port memory bit cell 502 in FIG. 6A, a read-assist circuit employing a positive supply rail positive boost circuit can be employed. The positive supply rail positive boost circuit is configured to weaken a pull-down NFET in one or more inverters in a storage circuit 501 of the PFET write port memory bit cell 502 in response to a read operation (block 606C in FIG. 6B). Examples of memory systems that include read-assist circuits employing a positive supply rail positive boost circuit for a PFET write port memory bit cell are shown in FIG. 12 discussed below.

Figure 7:
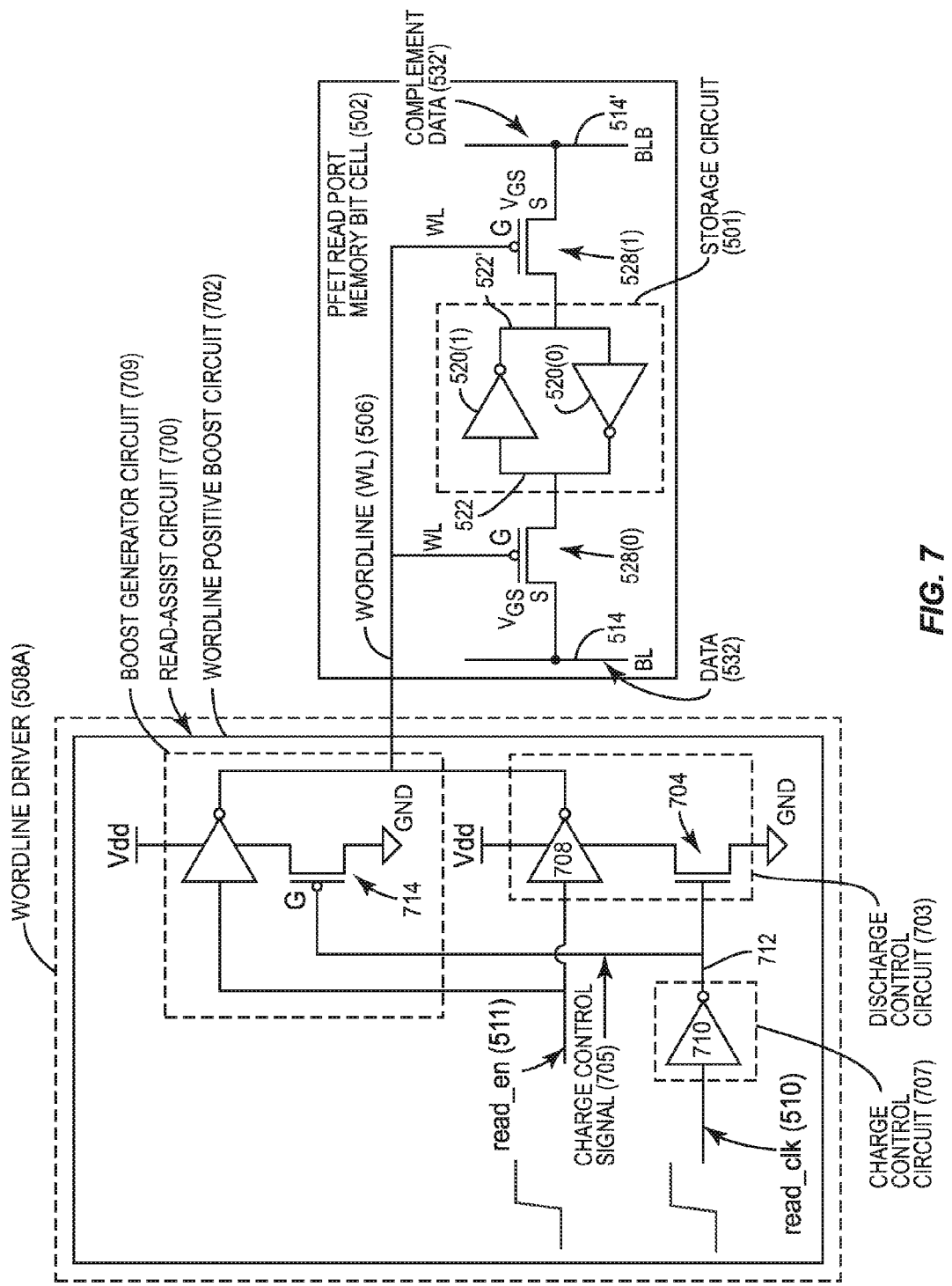
FIG. 7 illustrates an exemplary read-assist circuit that includes an exemplary positive wordline boost circuit provided in a wordline driver to positively boost a wordline of the memory bit cell in FIG. 5 to weaken PFET access transistors in the memory bit cell in response to a read operation to mitigate or avoid a read disturb condition.

As discussed above, to mitigate or avoid read disturb conditions in the PFET read port memory bit cell 502 in FIG. 6A, the PFET access transistors 528(0), 528(1) can be weakened during read operations. In this manner, the wrong voltage (e.g., GND voltage) is not driven from the pre-discharged bitline 114 and the complement bitline 114' into the true storage node 522 and complement storage node 522', respectively. In this regard, FIG. 7 illustrates an exemplary wordline driver 508A that includes a read-assist circuit 700 in the form of a wordline positive boost circuit 702. The wordline positive boost circuit 702 in this example is configured to positively boost the voltage on the wordline (WL) 506 to weaken the PFET access transistors 528(0), 528(1) in response to a read operation to mitigate or avoid a read disturb condition from occurring. In this manner, the PFET access transistors 528(0) or 528(1) do not drive the voltages from the bitline 114 or the complement bitline 114' into the true storage node 522 or complement storage node 522', respectively, in response to a read operation, thus causing a read disturb condition. By boosting the voltage on the wordline (WL) 506, the drive current $I_D$ (i.e., drive strength) of the PFET access transistors 528(0), 528(1) is weakened according to the following saturation drive current equation by decreasing gate (G) voltage-to-source (S) voltage (Vgs), as follows:

$$I_D = \tfrac{1}{2}\mu C_{ox} W/L (V_{GS} - V_{TH})^2$$

where:
$I_D$ is drive current,
'$\mu$' is the charge carrier effective mobility,
'W' is the gate width,
'L' is the gate length,
'$C_{ox}$' is the capacitance of the oxide layer;
'$V_{GS}$' is the gate to source Voltage, and
'$V_{TH}$' is the threshold voltage.

With reference to FIG. 7, to perform a read or write operation in the memory bit cell 502 in FIG. 7, the wordline (WL) 506 must be driven to a logical '0' to turn on the PFET access transistors 528(0), 528(1) in the memory bit cell 502. In a read operation, the wordline (WL) 506 is driven to a logical '0' after the bitline 514 and the complement bitline 514' are pre-discharged. In this regard, the wordline driver 508A in FIG. 7 includes a discharge control circuit 703. The discharge control circuit 703 is coupled to the wordline (WL) 506. The discharge control circuit 703 is configured to receive a charge control signal 705 from a charge control circuit 707 as an input. As discussed in more detail below, the discharge control circuit 703 is configured to couple the wordline (WL) 506 to the ground node (GND) in response to the charge control signal 705 indicating a charge disable state. However, as also discussed in more detail below, the discharge control circuit 703 is also configured to decouple the wordline (WL) 506 from the ground node (GND) to leave the wordline (WL) 506 in a floating state to allow a boost generator circuit 709 to positively boost the voltage on the wordline (WL) 506 in response to the charge control signal 705 indicating a charge enable state. In this example, the discharge control circuit 703 includes an NFET 704. The NFET 704 is activated during a write operation to drive the wordline (WL) 506 to a logical '0' to activate the PFET access transistors 528(0), 528(1) during a write operation, because the charge control signal 705 is based on the read clock signal 510 inverted by inverter 710 in the charge control circuit 707. When a write operation is to be performed, a read enable signal 511 transitions high to select the memory bit cell 502 for the write operation. An output 712 of an inverter 710 in the charge control circuit 707 activates the NFET 704 in the discharge control circuit 703 to pass the GND voltage to the wordline (WL) 506. The NFET 704 passes a strong logical '0' signal.

However, in response to a read operation, the NFET 704 in the discharge control circuit 703 is shut off due to the inverter 708 inverting the read clock signal 510, which has transitioned from low to high, on the output 712, which has transitioned from high to low. This leaves the wordline (WL) 506 floating. The boost generator circuit 709 provided in the wordline positive boost circuit 702 is activated based on the charge control signal 705 and the read enable signal 511 in this example indicating a read operation, to positively boost the voltage of the wordline (WL) 506 to weaken the PFET access transistors 528(0), 528(1).

In this example, a PFET 714 is included in the boost generator circuit 709. The gate (G) of the PFET 714, which is coupled to the output 712 of the inverter 710 in the charge control circuit 707, is activated in response to a read operation to boost the wordline (WL) 506. When the read enable signal 511 is a logical '1', the PFET 714 in the boost generator circuit 709 passes a signal above GND voltage, between a threshold voltage (Vt) and GND voltage, to the wordline (WL) 506. This is because a PFET 714 passes a weak logical '0' signal. Thus, instead of the wordline (WL) 506 being driving all the way down to the GND voltage (logical '0') in a charge disable state based on the charge control signal 705 and read enable signal 511, the wordline (WL) 506 is driven to a voltage level between Vt and GND voltage. This has the effect of weakening the PFET access transistors 528(0), 528(1) to provide a read-assist during read operations in the memory bit cell 502. Thus, the drive strength of the PFETs 524(0), 524(1) in the inverters 520(0), 520(1) (see FIG. 6A) in the memory bit cell 502 can overcome the weakened PFET access transistors 528(0), 528(1) in response to a read operation to quickly re-charge any lost charge on a true storage node 522 or complement storage node 522' at a voltage of logical '1', which is to be coupled to the bitline 514 or complement bitline 514'.

Figure 8:
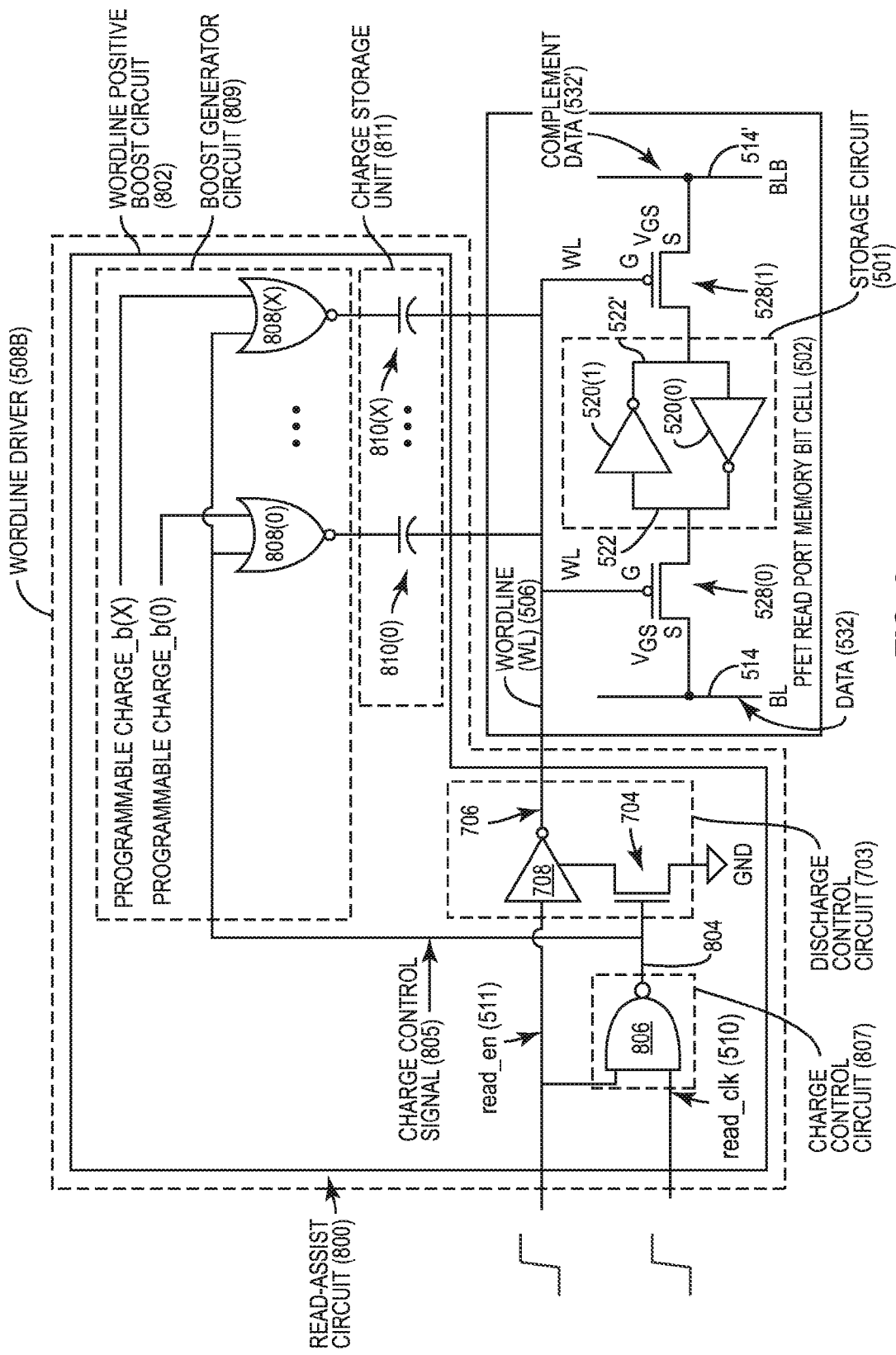
FIG. 8 illustrates an another exemplary read-assist circuit that includes another exemplary positive wordline boost circuit provided in a wordline driver to programmably positively boost a wordline of the memory bit cell in FIG. 5 to weaken PFET access transistors in the bit cells in response to a read operation to mitigate or avoid a read disturb condition.

FIG. 8 is another exemplary wordline driver 508B that includes a read-assist circuit 800 in the form of another example of a wordline positive boost circuit 802. Like the wordline positive boost circuit 702 in FIG. 7, the wordline positive boost circuit 802 in FIG. 8 is configured to boost the wordline (WL) 506 in the memory bit cell 502 to weaken the PFET access transistors 528(0), 528(1) in response to a read operation to mitigate or avoid a read disturb condition from occurring. In this manner, the PFET access transistors 528(0) or 528(1) do not drive the voltages from the bitline 114 or the complement bitline 114' into the true storage node 522 or the complement storage node 522', respectively, in response to a read operation, thus causing a read disturb condition. Common elements between the wordline positive boost circuit 802 in FIG. 8 and the wordline positive boost circuit 702 in FIG. 7 are shown with common element numbers, and thus will not be re-described.

With reference to FIG. 8, the wordline positive boost circuit 802 in this example is configured to weakly turn on PFET access transistors 528(0), 528(1) such that a read operation does not disturb the data 532 and/or complement data 532' stored in the storage circuit 501 of the PFET read port memory bit cell 502. In this regard, the gates (G) of the PFET access transistors 528(0), 528(1) are momentarily driven to logical '0' (e.g., GND). The gates (G) of the PFET access transistors 528(0), 528(1) are then raised to a voltage higher than logical '0' in response to a read operation while still keeping the PFET access transistors 528(0), 528(1) on or active, to avoid or mitigate a read disturb condition.

In this regard, with continued reference to FIG. 8, while the read clock signal 510 is at logical '0', and the read enable signal 511 is driven to logical '1', the inverter 708 in the discharge control circuit 703 drives the wordline (WL) 506 to logical '0.' This activates or turns on the PFET access transistors 528(0), 528(1) outside of a read operation. An output 804 of the charge control circuit 807 is driven to logical '1' by the read clock signal 510 being logical '0 and the read enable signal 511, which generates a charge control signal 805. The charge control signal 805 being a logical '1' activates or turns on the NFET 704 in the discharge control circuit 703. This causes the wordline (WL) 506 to be driven to ground (GND) voltage through the NFET 704 in the charge control circuit 807 outside of a read operation. Also, the charge control signal 805 being logical '1' causes a boost generator circuit 809 in the wordline positive boost circuit 802 to not be activated to couple a positive charge onto the wordline (WL) 506 to boost the voltage of the wordline (WL) 506 in response to the read operation.

However, once the read clock signal 510 is driven to logical '1,' meaning that a read operation is enabled, the output 804 of a NAND gate 806 in the charge control circuit 807 is driven to logical '0.' This disables the NFET 704 in the discharge control circuit 703, which causes the wordline (WL) 506 to float and not be driven to ground (GND) voltage through the NFET 704. Also in response to the read operation, the output 804 in the charge control circuit 807 is driven to logical '0' to also drive the charge control signal 805 to logical '0.' The charge control signal 805 being logical '0' causes the boost generator circuit 809 in the wordline positive boost circuit 802 to be activated to couple a positive charge onto the wordline (WL) 506 to boost the voltage of the wordline (WL) 506 in response to the read operation, and thus weaken the PFET access transistors 528(0), 528(1).

In this example, the boost generator circuit 809 includes a plurality of charge generating circuits 808(0)-808(X) provided in the form of NOR gates. The charge generating circuits 808(0)-808(X) are enabled by programmable charge signals b(0)-b(X), respectively, such that the amount of charge generated by the boost generator circuit 809 is proportionally programmable. In response to the charge generating circuits 808(0)-808(X) being enabled, the voltage of the wordline (WL) 506 will be positively boosted by a voltage proportional to the number and the value of respective charge storage circuits 810(0)-810(X) in a charge storage unit 811 that are programmed to couple onto the wordline (WL) 506. In this example, the charge storage circuits 810(0)-810(X) are comprised of capacitors.

Figure 9:
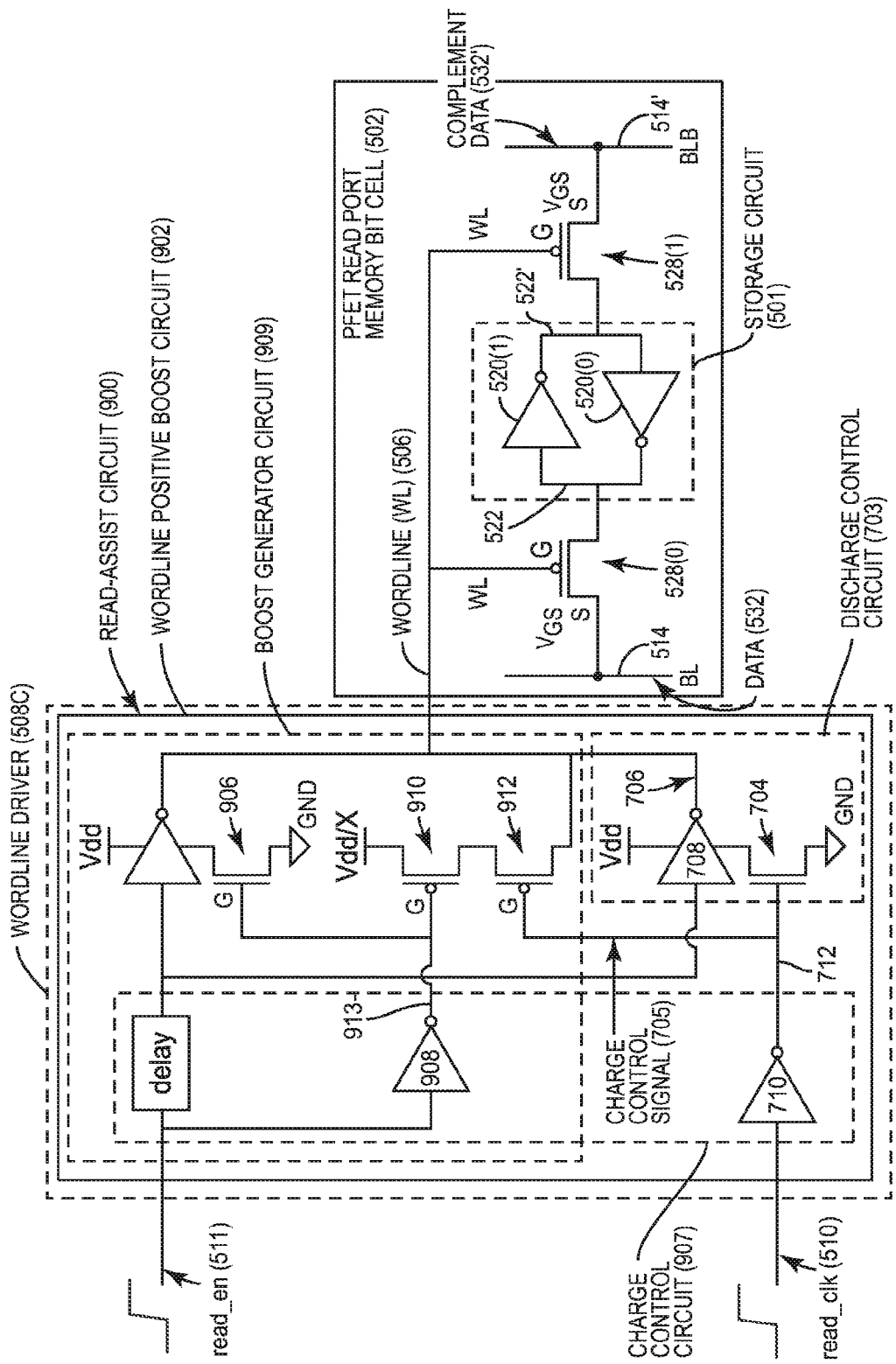
FIG. 9 illustrates an another exemplary read-assist circuit that includes another exemplary positive wordline boost circuit provided in a wordline driver to positively boost a wordline of the memory bit cell in FIG. 5 based on a different voltage supply than used for driving the wordline during write operations, to weaken PFET access transistors in the memory bit cell in response to a read operation to mitigate or avoid a read disturb condition.

FIG. 9 is another exemplary wordline driver 508C that includes a read-assist circuit 900 in the form of a wordline positive boost circuit 902. The wordline positive boost circuit 902 is similar to the wordline positive boost circuit 702 in FIG. 7, except that the wordline boost circuit 902 in FIG. 9 allows a different voltage (Vdd/X) other than the voltage (Vdd) powering the inverter 708 in FIG. 9 to be driven onto the wordline (WL) 506 to boost the voltage of the wordline (WL) 506. Common components in the wordline driver 508C between FIG. 7 and FIG. 9 are shown with common element numbers, and thus will not be re-described.

With reference to FIG. 9, in response to a read operation, as previously discussed, the NFET 704 in the discharge control circuit 703 is turned off due to the inverter 710 in the charge control circuit 907 inverting the read clock signal 510 on the output 712. This leaves the wordline (WL) 506 floating. The gate (G) of an NFET 906 provided in a boost generator circuit 909 receives a signal based on the read enable signal 511 from the output 913 of the inverter 908 in a charge control circuit 907. In this manner, the NFET 906 is not activated in response to a read operation such that the voltage Vdd is not provided to the wordline (WL) 506 to boost the wordline (WL) 506 to voltage (Vdd). Instead, to allow for the option to boost the voltage of the wordline (WL) 506 based on a voltage other than voltage (Vdd), such as voltage Vdd/X, the boost generator circuit 909 also includes a PFET 910 to provide voltage Vdd/X to another PFET 912 in this example. The PFET 910 is activated based on an output 913 of the inverter 908 in response to a read operation (i.e., the read enable signal 511) such that voltage Vdd/X is provided to the PFET 912 in response to a read operation. The PFET 912 behaves like the PFET 714 in the boost generator circuit 709 in FIG. 7 to boost the voltage of the wordline (WL) 506 in response to a read operation, except that the PFET 912 in the boost generator circuit 909 in FIG. 9 can boost the voltage wordline (WL) 506 based on a different voltage supply providing voltage Vdd/X in this example.

Figure 10:
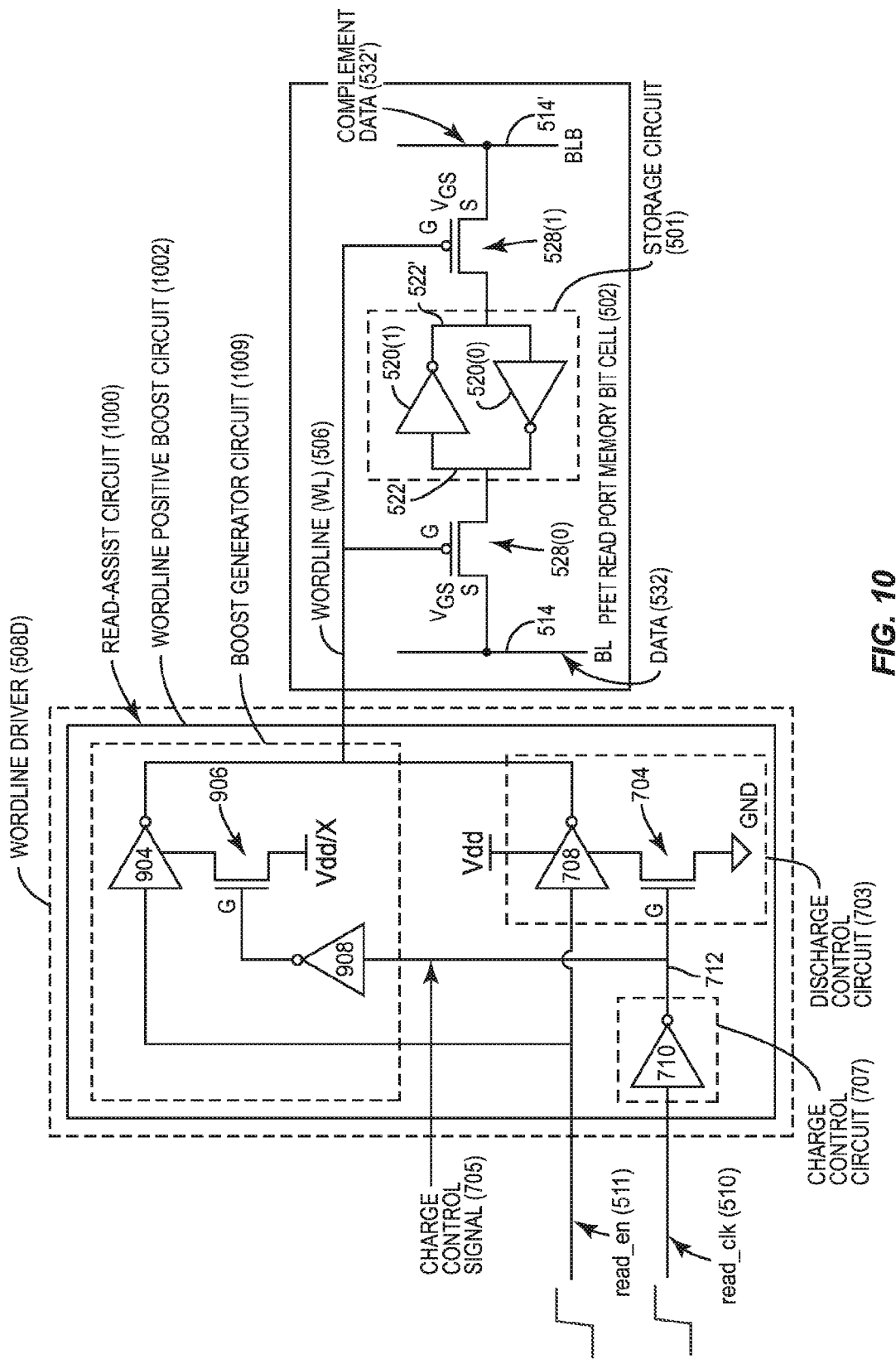
FIG. 10 illustrates an another exemplary read-assist circuit that includes another exemplary positive wordline boost circuit provided in a wordline driver to positively boost a wordline of the memory bit cell in FIG. 5 based on a different voltage supply than used for driving the wordline during write operations, to weaken PFET access transistors in the memory bit cell in response to a read operation to mitigate or avoid a read disturb condition.

FIG. 10 is another exemplary wordline driver 508D that is configured to positively boost the wordline (WL) 506 to a voltage other than voltage Vdd in response to a read operation. In this regard, the wordline driver 508D includes a read-assist circuit 1000 in the form of another example of a wordline positive boost circuit 1002. The wordline positive boost circuit 1002 is similar to the wordline positive boost circuit 702 in FIG. 7 and the wordline boost circuit 902 in FIG. 9. Common components in the wordline driver 508D between FIG. 10 and the wordline driver 508A and 508C in FIGS. 7 and 9 are shown with common element numbers in FIG. 10, and thus will not be re-described. A boost generator circuit 1009 provided in the wordline positive boost circuit 1002 in FIG. 10 includes an NFET 906 like included in the boost generator circuit 909 in FIG. 9. However, in the boost generator circuit 1009 in FIG. 10, instead of the NFET 906 being sourced to ground GND, the NFET 906 is sourced to voltage Vdd/X. The NFET 906 is activated based on the read clock signal 510, which causes the charge control circuit 707 to generate the output 712 to cause the inverter 908 to activate the NFET 906 in response to a read operation. In response to the read operation, the NFET 906 couples voltage Vdd/X to the wordline (WL) 506 to boost the wordline (WL) 506 to voltage Vdd/X, which may be a fraction of voltage (Vdd).

The wordline positive boost circuits 702, 802, 902, and 1002 in FIGS. 7-10 all are capable of providing a voltage boost to the wordline (WL) 506 of the memory bit cell 502 during read operations to mitigate or avoid read disturb conditions in the memory bit cell 502. It is also possible to boost the bitline 514 and complement bitline 514' in the memory bit cell 502, instead of boosting the wordline (WL) 506, to mitigate or avoid read disturb conditions in the memory bit cell 502 that employs the PFET read ports through the PFET access transistors 528(0), 528(1). Boosting the bitline 514 and the complement bitline 514' in the memory bit cell 502 in response to a read operation can reduce the gate (G) voltage-to-source (S) voltage (Vgs) of the PFET access transistors 528(0), 528(1), and thus weakens the PFET access transistors 528(0), 528(1). This is opposed to a full voltage Vdd voltage being provided across a PFET access transistor 528(0) or 528(1) when a logical '1' is stored at a respective true storage node 522 or complement storage node 522'. It is also possible to boost the bitline 514 and complement bitline 514' in lieu of or in combination with boosting the wordline (WL) 506 to weaken the PFET access transistors 528(0), 528(1) during read operations to mitigate or avoid read disturb conditions.

In this regard, FIG. 11 is a circuit diagram of the sense amplifier 516, a read-assist circuit 1100 in the form of a bitline positive boost circuit 1102 and a PFET read port memory bit cell 502 of the SRAM system 500 in FIG. 5. In this example, the bitline positive boost circuit 1102 is provided in a bitline driver 512 for a bit cell column M of the PFET read port memory bit cell 502. The bitline positive boost circuit 1102 is configured to boost voltage on the bitline 514 and complement bitline 514' in response to a read operation for the memory bit cell 502 to weaken the respective PFET access transistors 528(0), 528(1). In this regard, the memory bit cell 502 is provided just as illustrated in FIG. 6A, and thus will not be re-described.

With reference to FIG. 11, when performing a read operation on the memory bit cell 502, the bitline 514 and the complement bitline 514' are pre-discharged before the wordline (WL) 506 is asserted, as previously described above. However, in the memory bit cell 502 in FIG. 6A and as shown in FIG. 11, the bitline 514 and the complement bitline 514' were pre-discharged to GND voltage. However, in this example in FIG. 11, the bitline positive boost circuit 1102 in this example includes PFETs 1004(0), 1004(1). This is opposed to, for example, providing NFETs for pre-discharging the bitline 514 and the complement bitline 514'. The PFETs 1004(0), 1004(1) in the bitline positive boost circuit 1102 are configured to pre-discharge the bitline 514 and the complement bitline 514', respectively, to the threshold voltage (Vt) of the PFETs 1004(0), 1004(1) in response to a pre-discharge enable 1106. The PFETs 1004(0), 1004(1) do not pass a strong logical '0' voltage. Thus, the bitline 514 and the complement bitline 514' are positively boosted to the threshold voltage (Vt) of the respective PFETs 1004(0), 1004(1) above GND during the pre-discharge stage. Subsequently, when the wordline (WL) 506 is asserted to read the memory bit cell 502 in response to a read operation, the gate (G) voltage-to-source (S) voltage (Vgs) of the PFET access transistor 528(0) or 528(1) is Vdd-Vt (i.e., Vdd voltage minus the threshold voltage (Vt) of the respective PFETs 1004(0), 1004(1)), which weakens the PFET access transistors 528(0), 528(1). This mitigates or avoids a read disturb condition that can occur when the true storage node 522 or the complement storage node 522' has a logical '1' voltage stored, as previously discussed above with regard to FIG. 6A.

It is also possible to increase the drive strength of the PFETs 524(0), 524(1) in the memory bit cell 502 in FIG. 6A, instead of or in addition to boosting the wordline (WL) 506 and/or boosting the bitline 514 and complement bitline 514' in the memory bit cell 502, to mitigate or avoid read disturb conditions in the memory bit cell 502. Boosting the pull-up PFETs 524(0), 524(1) in the memory bit cell 502 in response to a read operation allows the pull-up PFETs 524(0), 524(1) to quickly re-charge any lost charge on the true storage node 522 or the complement storage node 522' as the voltage at the true storage node 522 is coupled to the bitline 514. Thus, any loss of charge due to charge sharing at the true storage node 522 or the complement storage node 522' is mitigated and can cause the respective inverters 520(0) or 520(1) to flip the voltage Vdd on the complement storage node 522' or the true storage node 522, respectively, from a logic '0' to a logic '1'.

In this regard, FIG. 12 illustrates an exemplary read-assist circuit 1200 in the form of a positive supply rail positive boost circuit 1202. The positive supply rail positive boost circuit 1202 is configured to boost the voltage of a positive supply rail 1203 of the PFET read port memory bit cell 502 that receives a supply voltage (Vdd) coupled to the pull-up PFETs 524(0), 524(1) of the cross-coupled inverters 520(0), 520(1) (see also, FIG. 5). In this regard, the positive supply rail positive boost circuit 1202 is configured to boost the voltage supplied to the pull-up PFETs 524(0), 524(1) to cause the pull-up PFETs 524(0), 524(1) to be stronger than the PFET access transistors 528(0), 528(1) in the memory bit cell 502 in response to a read operation to mitigate or avoid a read disturb condition. As discussed below, the positive supply rail positive boost circuit 1202 is configured to couple the pull-up PFETs 524(0), 524(1) to a higher voltage than voltage (Vdd) in this example.

In this regard, with reference to FIG. 12, when a read operation occurs according to the transition of the read clock signal 510 provided as a charge control signal 1205 to a higher voltage level, the read clock signal 510 is provided as an input to a boost generator circuit 1209. In this example, the boost generator circuit 1209 is comprised of a plurality of charge generating circuits 1204(0)-1204(Y) provided in the form of AND gates. The charge generating circuits 1204(0)-1204(Y) also have respective programmable charge lines 1206(0)-1206(Y) that can be programmed to allow any number of the charge generating circuits 1204(0)-1204(Y) desired to charge respective charge storage circuits 1208(0)-1208(Y) provided in a charge storage unit 1211 in this example. The charge storage circuits 1208(0)-1208(Y) are capacitors in this example. During the read operation, the charge stored in the charge storage circuits 1208(0)-1208(Y) is coupled to an output 1210 of the charge storage unit 1211, which is coupled to the positive supply rail 1203 and to the pull-up PFETs 524(0), 524(1). In this manner, the charge discharged from the charge storage unit 1211 to the positive supply rail 1203 boosts the voltage coupled to the pull-up PFETs 524(0), 524(1) above voltage (Vdd), thus strengthening the PFETs 524(0), 524(1) and the cross-coupled inverters 520(0), 520(1). During a write operation, the charge generating circuits 1204(0)-1204(Y) are not driving the output 1210 coupled to the positive supply rail 1203, and thus the output 1210 is left floating such that only voltage (Vdd) is coupled to the pull-up PFETs 524(0), 524(1) in the inverters 520(0), 520(1) for normal write operations.

The read-assist circuits for memory bit cells employing a PFET read port(s) disclosed herein to mitigate or avoid read disturb conditions for the PFET read port memory bit cells according to aspects disclosed herein, may be provided in or integrated into a memory in any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 13:
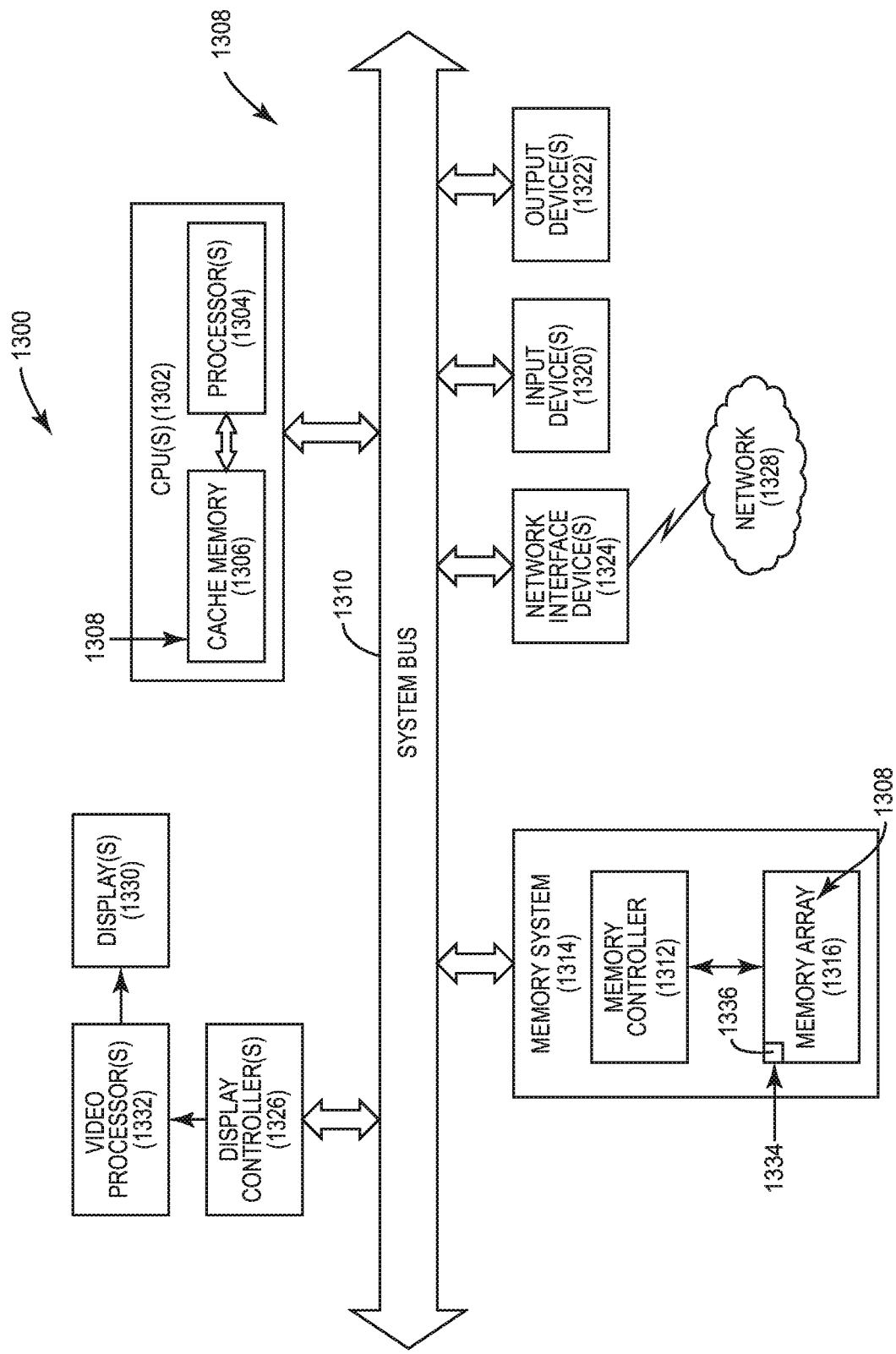
FIG. 13 is a block diagram of an exemplary processor-based system that can include memory systems that employ read-assist circuits for memory bit cells employing PFET read ports, and according to any of the aspects disclosed herein.

In this regard, FIG. 13 illustrates an example of a processor-based system 1300. Any component or circuit of the processor-based system 1300 can employ PFET read port memory bit cells employing read-assist circuits disclosed herein to mitigate or avoid read disturb conditions for the PFET read port memory bit cells according to aspects disclosed herein. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. As an example, the cache memory 1306 can employ PFET read port memory bit cells 1308, including the PFET read port memory bit cell 502 illustrated in FIG. 5. The CPU(s) 1302 is coupled to a system bus 1310 and can intercouple master and slave devices included in the processor-based system 1300. As is well known, the CPU(s) 1302 communicates with these other devices by exchanging address, control, and data information over the system bus

1310. For example, the CPU(s) 1302 can communicate bus transaction requests to a memory controller 1312 in a memory system 1314 as an example of a slave device. Although not illustrated in FIG. 13, multiple system buses 1310 could be provided, wherein each system bus 1310 constitutes a different fabric. In this example, the memory controller 1312 is configured to provide memory access requests to a memory array 1316 in the memory system 1314. As an example, the memory array 1316 can also include PFET read port memory bit cells 1308 that include read-assist circuits.

Other devices can be connected to the system bus 1310. As illustrated in FIG. 13, these devices can include the memory system 1314, one or more input devices 1320, one or more output devices 1322, one or more network interface devices 1324, and one or more display controllers 1326, as examples. The input device(s) 1320 can include any type of input device, including but not limited to input keys, switches, voice processors, etc. The output device(s) 1322 can include any type of output device, including but not limited to audio, video, other visual indicators, etc. The network interface device(s) 1324 can be any devices configured to allow exchange of data to and from a network 1328. The network 1328 can be any type of network, including but not limited to a wired or wireless network, a private or public network, a local area network (LAN), a wide local area network (WLAN), and the Internet. The network interface device(s) 1324 can be configured to support any type of communications protocol desired.

The CPU(s) 1302 may also be configured to access the display controller(s) 1326 over the system bus 1310 to control information sent to one or more displays 1330. The display controller(s) 1326 sends information to the display(s) 1330 to be displayed via one or more video processors 1332, which process the information to be displayed into a format suitable for the display(s) 1330. The display(s) 1330 can include any type of display, including but not limited to a cathode ray tube (CRT), a liquid crystal display (LCD), a plasma display, etc.

A non-transitory computer-readable medium, such as the memory system 1314 in FIG. 13 as a non-limiting example, may also have stored thereon computer executable instructions which, when executed, cause the CPU(s) 1302 to store a library cell 1334 for an integrated circuit (IC) design. The library cell 1334 may be part of a cell library. The library cell 1334 comprises a library memory bit cell 1336, which may be a library cell based on the design of any PFET read port memory bit cells discussed herein. As discussed above, the PFET read port memory bit cells comprise a storage circuit configured to store data. The PFET read port memory bit cells also comprise one or more PFET access transistors coupled to the storage circuit. Each of the one or more PFET access transistors comprises a gate configured to be activated by a wordline in response to a read operation to cause the one or more PFET access transistors to pass the data from the storage circuit to a bitline read-assist circuit coupled to the library memory bit cell 1336. The library cell 1334 may also comprise a read-assist circuit configured to boost a voltage in the library memory bit cell 1336 in response to the read operation to assist in transferring the data from the storage circuit to a bitline.

Note that the use of PFET and NFET in this disclosure can include PMOSFETs and NMOSFETs that are metal oxide semiconductors (MOSs). The PFETs and NFETs discussed herein can include other types of oxide layers other than metal. Also note that any of the assist circuits disclosed herein can be provided for either or both of the bitline and complement bitline of the memory bit cells disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory system, comprising:
a memory bit cell, comprising:
a storage circuit configured to store data;
one or more P-type Field-Effect Transistor (PFET) access transistors coupled to the storage circuit; and
each of the one or more PFET access transistors comprising a gate configured to be activated by a wordline in response to a read operation to cause the one or more PFET access transistors to pass the data from the storage circuit to a bitline read-assist circuit coupled to the memory bit cell; and
a read-assist circuit configured to boost a voltage in the memory bit cell in response to the read operation to assist in transferring the data from the storage circuit to a bitline,
wherein the read-assist circuit comprises:
a wordline positive boost circuit coupled to the wordline and configured to positively boost a voltage on the wordline to positively boost a voltage of the gate of the one or more PFET access transistors in response to the read operation, wherein the wordline positive boost circuit comprises:
a boost generator circuit coupled to the wordline, the boost generator circuit configured to positively boost the voltage on the wordline based on a fraction of a supply voltage of the memory bit cell in response to the read operation.

2. The memory system of claim 1, wherein:
the storage circuit comprises one or more inverters each comprising a pull-up PFET coupled to a pull-down N-type FET (NFET).

3. The memory system of claim 1, wherein the one or more PFET access transistors comprises:
a first PFET access transistor coupled to the storage circuit, the first PFET access transistor comprising a first gate configured to be activated by the wordline in response to the read operation to cause the first PFET access transistor to pass the data from the storage circuit to the bitline; and
a second complement PFET access transistor coupled to the storage circuit, the second complement PFET access transistor comprising a second gate configured to be activated by the wordline in response to the read operation to cause the second complement PFET access transistor to pass complement data complementary to the data from the storage circuit to a complement bitline.

4. The memory system of claim 3, wherein:
the storage circuit is comprised of a storage node and a complement storage node;
the first PFET access transistor is configured to pass the data from the storage node to the bitline in response to activation of the wordline for the read operation; and
the second complement PFET access transistor is configured to pass the complement data from the complement storage node to the complement bitline in response to activation of the wordline for the read operation.

5. The memory system of claim 1, wherein the one or more PFET access transistors each further comprises a source; and
the read-assist circuit is configured to positively boost a voltage across a gate (G) voltage-to-source (S) voltage (Vgs) of the one or more PFET access transistors in response to the read operation.

6. The memory system of claim 1, wherein the wordline positive boost circuit is configured to positively boost the voltage of the gate of the one or more PFET access transistors in response to a read enable signal indicating the read operation.

7. The memory system of claim 1, wherein the boost generator circuit is configured to positively boost the voltage on the wordline based on the supply voltage of the memory bit cell in response to the read operation.

8. The memory system of claim 1, wherein:
the wordline positive boost circuit further comprises a charge control circuit configured to generate a charge control signal in response to a read clock signal indicating a charge enable state outside of the read operation or a charge disable state for the read operation; and
the boost generator circuit is further configured to positively charge the voltage on the wordline in response to the charge control signal indicating a charge enable state.

9. The memory system of claim 8, wherein the wordline positive boost circuit further comprises a discharge control circuit coupled to the wordline and configured to receive the charge control signal as an input, the discharge control circuit configured to:
couple the wordline to a ground node to prevent the charge control circuit from positively boosting the voltage on the wordline in response to the charge control signal indicating a charge enable state; and
place the wordline in a floating state to allow the boost generator circuit to positively charge the voltage on the wordline in response to the charge control signal indicating a charge disable state.

10. The memory system of claim 9, wherein the discharge control circuit comprises an N-type FET (NFET) coupled between the wordline and the ground node, wherein a gate of the NFET is configured to receive the charge control signal.

11. The memory system of claim 1, wherein the wordline positive boost circuit comprises a boost generator circuit and a charge storage unit coupled to the boost generator circuit of the wordline positive boost circuit and the wordline;
the charge storage unit configured to store a charge; and
the boost generator circuit configured to:
generate a charge to be stored in the charge storage unit outside of the read operation; and
couple the charge stored in the charge storage unit onto the wordline to positively boost the voltage on the wordline in response to the read operation.

12. The memory system of claim 11, wherein the boost generator circuit is comprised of a plurality of programmable charge generating circuits each configured to selectively contribute to the charge stored in the charge storage unit in response to a respective programmable charge signal.

13. The memory system of claim 1, comprising a plurality of memory bit cells each configured to store voltage data in response to a write operation, each memory bit cell among the plurality of memory bit cells comprising one or more PFET access transistors each comprising a gate configured to be activated by the wordline in response to the read operation; and
the read-assist circuit configured to positively boost a voltage in the plurality of memory bit cells in response to the read operation to assist in transferring the data from the storage circuit to the bitline.

14. The memory system of claim 13, wherein the plurality of memory bit cells are disposed in a memory bit cell row of a memory array.

15. The memory system of claim 1 provided in a processor-based system.

16. The memory system of claim 15, wherein the processor-based system is comprised of a central processing unit (CPU)-based system.

17. The memory system of claim 1 integrated into a system-on-a-chip (SoC).

18. The memory system of claim 1 integrated into a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

19. A method of reading data from a memory bit cell, comprising:
pre-discharging at least one bitline coupled to an access node of one or more P-type Field-Effect Transistor (PFET) access transistors in a memory bit cell in response to a read operation;
activating a wordline coupled to a gate of the one or more PFET access transistors in response to the read operation to transfer data from a storage circuit to the access node and the at least one bitline; and
boosting a voltage in the memory bit cell in response to the read operation to assist in transferring the data from the storage circuit to the access node by positively boosting a voltage on the wordline based on a fraction of a supply voltage of the memory bit cell in response to the read operation.

20. The method of claim 19, wherein:
pre-discharging the at least one bitline comprises:
pre-discharging a bitline coupled to a first access node of a first PFET access transistor in the memory bit cell in response to the read operation; and
pre-discharging a complement bitline coupled to a second access node of a second complement PFET access transistor in the memory bit cell in response to the read operation;
activating the wordline comprises:
activating the wordline coupled to a gate of the first PFET access transistor in response to the read operation to transfer first data from the storage circuit to the first access node to the bitline; and
activating the wordline coupled to a gate of the second complement PFET access transistor in response to the read operation to transfer second data from the storage circuit to the second access node to the complement bitline; and
boosting the voltage comprises boosting the voltage in the memory bit cell in response to the read operation to assist transferring the first data from the storage circuit to the first access node and transferring the second data from the storage circuit to the second access node.

21. The method of claim 19, wherein boosting the voltage comprises positively boosting a voltage across a gate (G) voltage-to-source (S) voltage (Vgs) of the one or more PFET access transistors in response to the read operation.

22. The method of claim 19, wherein boosting the voltage comprises positively boosting the voltage on the wordline to positively boost a voltage of the gate of the one or more PFET access transistors in response to the read operation.

23. The method of claim 19, further comprising:
generating a charge control signal in response to a read clock signal indicating a charge enable state outside of the read operation or a charge disable state for the read operation;
wherein positively boosting the voltage comprises positively charging the voltage on the wordline in response to the charge control signal indicating a charge enable state.

24. The method of claim 23, further comprising:
coupling the wordline to a ground node to prevent positively boosting the voltage on the wordline in response to the charge control signal indicating a charge enable state; and
placing the wordline in a floating state to allow for positively charging the voltage on the wordline in response to the charge control signal indicating a charge disable state.

25. The method of claim 22, further comprising:
storing a charge in a charge storage unit coupled to the wordline;
generating a charge to be stored in the charge storage unit outside of the read operation; and
coupling the charge stored in the charge storage unit onto the wordline to positively boost the voltage on the wordline in response to the read operation.

26. The method of claim 25, further comprising selectively programming an amount of the charge to be stored in the charge storage unit in response to a respective programmable charge signal.

27. A non-transitory computer-readable medium having stored thereon computer data for a library cell for an integrated circuit (IC), the library cell comprising:
a memory system that comprises a memory bit cell, comprising:
a storage circuit configured to store data;
one or more P-type Field-Effect Transistor (PFET) access transistors coupled to the storage circuit; and
each of the one or more PFET access transistors comprising a gate configured to be activated by a wordline in response to a read operation to cause the one or more PFET access transistors to pass the data from the storage circuit to a bitline read-assist circuit coupled to the memory bit cell; and
a read-assist circuit configured to boost a voltage in the memory bit cell in response to the read operation to assist in transferring the data from the storage circuit to a bitline,
wherein the read-assist circuit comprises:
a wordline positive boost circuit coupled to the wordline and configured to positively boost a voltage on the wordline to positively boost a voltage of the gate of the one or more PFET access transistors in response to the read operation, wherein the wordline positive boost circuit comprises:
a boost generator circuit coupled to the wordline, the boost generator circuit configured to positively boost the voltage on the wordline based on a fraction of a supply voltage of the memory bit cell in response to the read operation.

* * * * *